US009064573B2

(12) United States Patent
Kawai et al.

(10) Patent No.: US 9,064,573 B2
(45) Date of Patent: Jun. 23, 2015

(54) WRITING METHOD OF VARIABLE RESISTANCE NON-VOLATILE MEMORY ELEMENT AND VARIABLE RESISTANCE NON-VOLATILE MEMORY DEVICE

(71) Applicant: PANASONIC CORPORATION, Osaka (JP)

(72) Inventors: Ken Kawai, Osaka (JP); Kazuhiko Shimakawa, Osaka (JP); Yoshikazu Katoh, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/229,365

(22) Filed: Mar. 28, 2014

(65) Prior Publication Data
US 2014/0301129 A1 Oct. 9, 2014

(30) Foreign Application Priority Data

Apr. 3, 2013 (JP) ................................. 2013-077348

(51) Int. Cl.
G11C 11/00 (2006.01)
G11C 13/00 (2006.01)

(52) U.S. Cl.
CPC .................................. G11C 13/0069 (2013.01)

(58) Field of Classification Search
USPC ......................... 365/148, 100, 189.11, 210.12
See application file for complete search history.

(56) References Cited

U.S. PATENT DOCUMENTS 8,395,925 B2 * 3/2013 Kawai et al. ................... 365/148
8,395,930 B2 * 3/2013 Muraoka et al. ............. 365/148
8,537,591 B2 * 9/2013 Kim et al. ..................... 365/148
8,619,460 B2 * 12/2013 Kanzawa et al. ............. 365/148
8,861,253 B2 * 10/2014 Chang et al. .................. 365/148

(Continued)

FOREIGN PATENT DOCUMENTS

JP 2007-004935 A 1/2007
JP 2013-048004 A 3/2013

OTHER PUBLICATIONS

I. G. Baek et al., "Highly Scalable Non-volatile Resistive Memory using Simple Binary Oxide Driven by Asymmetric nipolar Voltage Pulses," IEDM2004, pp. 587.

Primary Examiner — Pho M Luu
(74) Attorney, Agent, or Firm — McDermott Will & Emery LLP

(57) ABSTRACT

A writing method of a variable resistance non-volatile memory element comprises determining, in a first determination step, whether or not a resistance state of the variable resistance non-volatile memory element does not switch to a first resistance state and remains in a second resistance state, when a pulse of a second voltage is applied to the variable resistance non-volatile memory element; and when it is determined that the resistance state of the variable resistance non-volatile memory element does not switch to the first resistance state and remains in the second resistance state in the first determination step, applying, in a recovery step, at least once to the variable-resistance non-volatile memory element a recovery voltage pulse set composed of two pulses which are a first recovery voltage pulse which has the same polarity as that of the first voltage and a second recovery voltage pulse which has the same polarity as that of the second voltage, has a greater amplitude than the second voltage, and is applied subsequently to the first recovery voltage pulse.

22 Claims, 15 Drawing Sheets

(56) References Cited

U.S. PATENT DOCUMENTS

| | | |
|---|---|---|
| 2009/0283736 A1 | 11/2009 | Kanzawa et al. |
| 2010/0207094 A1 | 8/2010 | Kanzawa et al. |
| 2011/0222331 A1 | 9/2011 | Kurosawa et al. |
| 2011/0294259 A1 | 12/2011 | Kanzawa et al. |
| 2013/0148408 A1 | 6/2013 | Kawai et al. |
| 2013/0188414 A1 | 7/2013 | Kawai et al. |

* cited by examiner

Before application of recovery voltage pulse set

After application of recovery voltage pulse set

Second recovery voltage pulse
Vcrh

| Operation | Normal operation | | | HR state writing recovery operation | | | | | | |
|---|---|---|---|---|---|---|---|---|---|---|
| | | | | Application of first recovery voltage pulse set | | HR state writing pulse set | Application of second recovery voltage pulse set | | HR state writing pulse set |
| | HR state writing | LR state writing | Normal reading | First recovery | Second recovery | HR state writing verify reading | First recovery | New second recovery | HR state writing verify reading |
| Applied voltage pulse | | | | | | | | | |
| WL | VL | VL | VDD | Vrcl | Vrch | VDD | Vrcl3 | Vrch3 | VDD |
| SL | 0V | VL | 0V | Vrcl | 0V | 0V | Vrcl3 | 0V | 0V |
| BL | VH⎍ 0V | ⎍VL 0V | Vread | Vrcl⎍ 0V | Vrch⎍ 0V | Vread | Vrcl3⎍ 0V | Vrch3⎍ 0V | Vread |

Fig. 10

Fig. 11A  LR state writing negative voltage pulse
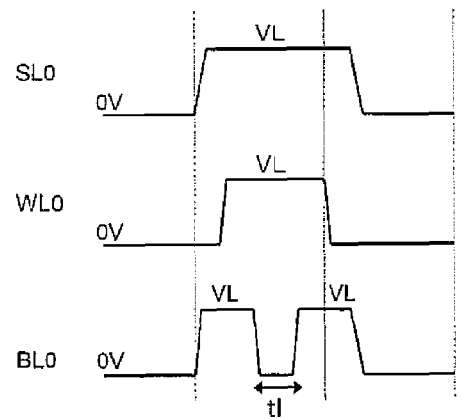
Fig. 11B  HR state writing positive voltage pulse
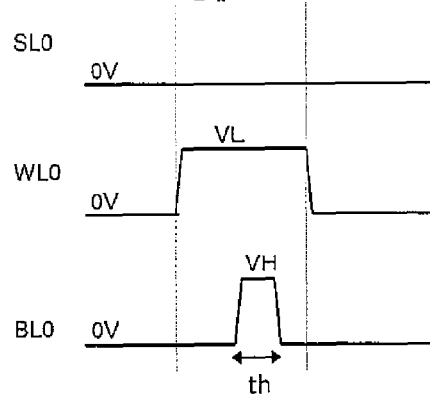
Fig. 11C  Reading voltage pulse
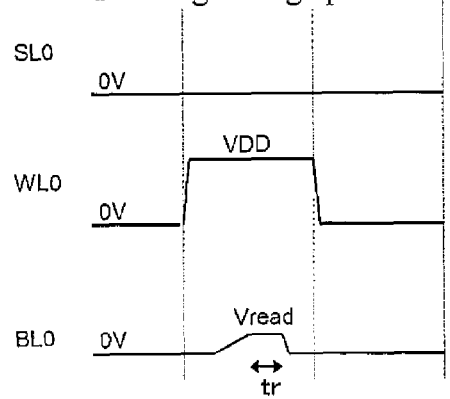

WRITING METHOD OF VARIABLE RESISTANCE NON-VOLATILE MEMORY ELEMENT AND VARIABLE RESISTANCE NON-VOLATILE MEMORY DEVICE

CROSS-REFERENCE TO RELATED PATENT APPLICATION

The application claims priority to Japanese Patent Application No. 2013-077348 filed on Apr. 3, 2013, the entire disclosure of which is incorporated herein by reference.

BACKGROUND OF THE DISCLOSURE

1. Field of the Disclosure

The present disclosure relates to a writing method of a variable resistance non-volatile memory element, and a variable resistance non-volatile memory device. More specifically, the present disclosure relates to a writing method of a bipolar variable resistance non-volatile memory element, and a bipolar variable resistance non-volatile memory device.

2. Description of the Related Art

In recent years, a variable resistance non-volatile memory device (hereinafter may be simply referred to as non-volatile memory device) incorporating a memory cell including a variable resistance non-volatile memory element (hereinafter may be simply referred to as variable resistance element) has been studied and developed (see e.g., Japanese Laid-Open Patent Application Publication No. 2007-4935 (FIGS. 1 and 2), International Publication No. 2008/149484, International Publication No. 2009/050833, I. G. Baek et al., IEDM2004, p. 587 (see FIG. 5(b)).

The variable resistance element refers an element having a characteristic in which its resistance value reversibly changes in response to an electric signal, and is able to store data corresponding to the changed resistance value in a non-volatile manner.

SUMMARY OF THE DISCLOSURE

In the above described prior arts, in a case where one high-resistance state writing voltage pulse and one low-resistance state writing voltage pulse are applied alternately in repetition, a resistance changing operation takes place stably in an initial stage of rewriting. However, when the number of times of rewriting is increased, a resistance changing state becomes unstable.

An object of one non-limiting and exemplary embodiment is to provide a writing method of a variable resistance non-volatile memory element, and a variable resistance non-volatile memory device, which can substantially resolve an unstable resistance changing phenomenon, which occurs in the conventional examples.

In one general aspect, the technique disclosed here is a writing method of a variable resistance non-volatile memory element, in which a voltage pulse is applied to the variable resistance non-volatile memory element to reversibly change a resistance state of the variable resistance non-volatile memory element, the variable resistance non-volatile memory element including a first electrode, a second electrode, and a variable resistance layer sandwiched between the first electrode and the second electrode; the variable resistance layer including a first metal oxide layer which is in contact with the first electrode, and a second metal oxide layer which is in contact with the second electrode and is lower in degree of oxygen deficiency than the first metal oxide layer; the variable resistance non-volatile memory element having a characteristic in which the variable resistance non-volatile memory element changes the resistance state from a first resistance state used to store first information to a second resistance state used to store second information by application of a pulse of a first voltage, and changes the resistance state from the second resistance state to the first resistance state by application of a pulse of a second voltage which is different in polarity from the first voltage; the writing method comprising: determining, in a first determination step, whether or not the resistance state of the variable resistance non-volatile memory element does not switch to the first resistance state and remains in the second resistance state, when the pulse of the second voltage is applied to the variable resistance non-volatile memory element; and when it is determined that the resistance state of the variable resistance non-volatile memory element does not switch to the first resistance state and remains in the second resistance state in the first determination step, applying, in a recovery step, at least once to the variable-resistance non-volatile memory element a recovery voltage pulse set composed of two pulses which are a first recovery voltage pulse which has the same polarity as that of the first voltage and a second recovery voltage pulse which has the same polarity as that of the second voltage, has a greater amplitude than the second voltage, and is applied subsequently to the first recovery voltage pulse.

In one general aspect, the technique disclosed here is a variable resistance non-volatile memory device comprising: a memory cell including a variable resistance non-volatile memory element and a switching element which are connected in series; and a drive circuit for driving the memory cell, the variable resistance non-volatile memory element including a first electrode, a second electrode, and a variable resistance layer sandwiched between the first electrode and the second electrode; the variable resistance layer including a first metal oxide layer which is in contact with the first electrode, and a second metal oxide layer which is in contact with the second electrode and is lower in degree of oxygen deficiency than the first metal oxide layer; the variable resistance non-volatile memory element having a characteristic in which the variable resistance non-volatile memory element changes the resistance state from a first resistance state used to store first information to a second resistance state used to store second information by application of a pulse of a first voltage, and changes the resistance state from the second resistance state to the first resistance state by application of a pulse of a second voltage which is different in polarity from the first voltage; the drive circuit including: a write circuit for writing information to the memory cell; a sense amplifier for reading the information from the memory cell; and a control circuit for determining using the sense amplifier, in a first determination step, whether or not the resistance state of the variable resistance non-volatile memory element does not switch to the first resistance state and remains in the second resistance state, when the pulse of the second voltage is applied to the variable resistance non-volatile memory element by the write circuit; the control circuit being configured to control the write circuit in such a manner that, when the control circuit determines that the resistance state of the variable resistance non-volatile memory element does not switch to the first resistance state and remains in the second resistance state in the first determination step, the control circuit performs a recovery step of causing the write circuit to apply at least once to the variable-resistance non-volatile memory element a recovery voltage pulse set composed of two pulses which are a first recovery voltage pulse which has the same polarity as that of the first voltage and a second recovery voltage pulse which has the same polarity as that of the second voltage, has a greater amplitude than the second voltage, and is applied subsequently to the first recovery voltage pulse.

According to one aspect of the present disclosure, it becomes possible to ensure a proper operation window even when the number of times of rewriting increases. As a result, it becomes possible to stably continue a resistance changing operation, and significantly improve reliability of the non-volatile memory device.

The benefits and/or advantages may be individually provided by the various embodiments and features of the specification and drawings disclosure, and need not all be provided in order to obtain one or more of the same.

BRIEF DESCRIPTION OF THE DRAWINGS

FIG. 10 is a table showing set voltages in respective operations according to Embodiment 1.

FIG. 11A is a view showing operation timings of the variable resistance non-volatile memory device according to Embodiment 1.

FIG. 11B is a view showing operation timings of the variable resistance non-volatile memory device according to Embodiment 1.

FIG. 11C is a view showing operation timings of the variable resistance non-volatile memory device according to Embodiment 1.

DETAILED DESCRIPTION OF THE EMBODIMENTS

Prior to describing the embodiment of the present disclosure, first of all, the problem to be solved by the present disclosure will be described in detail.

[Background Art]

As a conventional non-volatile memory device including a variable resistance element, there is generally known a non-volatile memory device in which 1T1R memory cells each including a MOS transistor and a variable resistance element which are connected in series, are arrayed in matrix in locations in the vicinity of cross-points of bit lines and word lines which are orthogonal to each other. In the 1T1R memory cell, one end of the two-terminal variable resistance element is connected to the bit line or a source line, while the other end thereof is connected to a drain or source of the transistor. A gate of the transistor is connected to the word line. The other end of the transistor is connected to the source line or the bit line (i.e., the source line or the bit line to which one end of the variable resistance element is not connected). The source line is placed in parallel with the bit line or the word line.

As another memory cell configuration, there is generally known a non-volatile memory device in which 1D1R cross-point memory cells each including a diode and a variable resistance element which are connected in series are arrayed in matrix at cross-points of bit lines and word lines which are orthogonal to each other.

Hereinafter, a typical conventional variable resistance element will be described.

Non-patent Literature 1 discloses a non-volatile memory including the 1T1R memory cell incorporating a transition metal oxide as the variable resistance element. I. G. Baek et al., IEDM2004 discloses that the transition metal oxide layer is an insulator in a normal state, and that it is necessary to conduct a forming process to form a conductive path for implementing switching between a high-resistance state and a low-resistance state to enable the resistance value of the transition metal oxide layer to change by application of an electric pulse.

Figure 4:
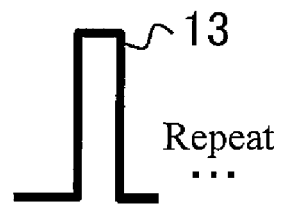
FIG. 4 is a schematic view of a pulse waveform in a case where only the second recovery voltage pulse is applied continuously, in Comparative example.
Figure 14:
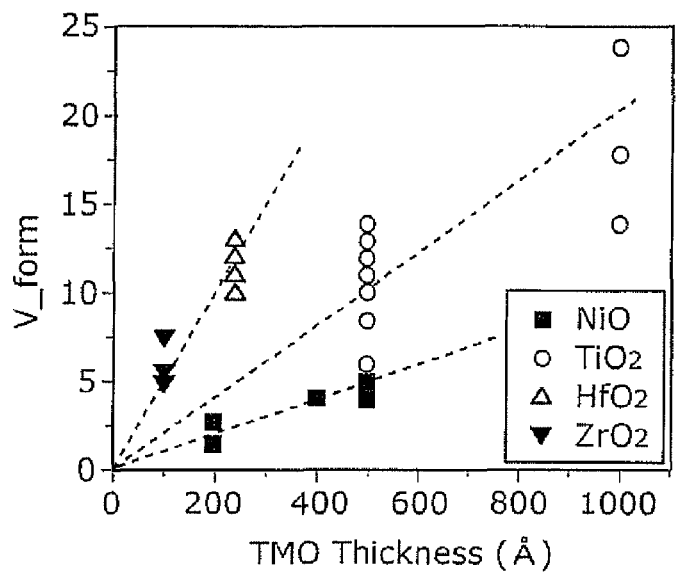
FIG. 14 is a view of characteristics showing dependency of a forming voltage on a transition metal oxide layer thickness, in a conventional variable resistance non-volatile memory element.

FIG. 14 is a view of characteristics showing dependency of a forming voltage (V_form) on a transition metal oxide thickness (TMO thickness) disclosed in I. G. Baek et al., IEDM2004. FIG. 4 shows the characteristics of four kinds of transition metal oxides which are NiO, $TiO_2$, $HfO_2$, and $ZrO_2$. The required forming voltage depends on the kind of the transition metal oxide. As the transition metal oxide thickness increases, the required forming voltage is greater. For this reason, to reduce the forming voltage, it is preferable that the transition metal oxide such as NiO is selected, and the transition metal oxide thickness is reduced. As defined herein, the forming refers to a step of applying a voltage with a greater magnitude than a voltage in a normal operation, to the variable resistance element so that the manufactured variable resistance element can reversibly change its resistance value in response to the electric signal (normal operation).

JP2007-4935A discloses a non-volatile memory including an ion conductive variable resistance element comprising an insulator layer (amorphous $Gd_2O_3$) and a conductor layer (CuTe).

Figure 15:
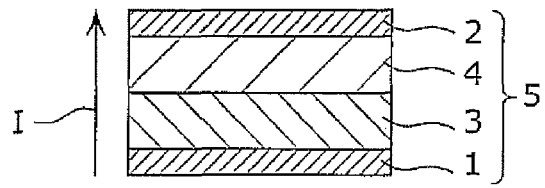
FIG. 15 is a schematic view of a cross-section of a conventional variable resistance element.

FIG. 15 is a schematic view of a cross-section of a variable resistance element 5 disclosed in JP2007-4935A.

The variable resistance element 5 has a stacked-layer structure in which a conductor layer 3 and an insulator layer 4 are sandwiched between two electrodes 1 and 2. Patent Literature 1 discloses as materials used as the conductor layer 3, a metal layer, an alloy layer (e.g., CuTe alloy layer), a metal compound layer, etc., comprising at least one metal element selected from, for example, Cu, Ag, and Zn. Patent Literature 1 also discloses as materials used as the insulator layer 4, for example, an insulator such as amorphous $Gd_2O_3$, and $SiO_2$.

In writing to the variable resistance element 5 of FIG. 15, when a voltage in which electric potential of the electrode 1 is higher than that of the electrode 2, is applied, metal element ions are drawn toward the electrode 2 and migrate into the insulator layer 4. When the ions reach the electrode 2, the upper and lower electrodes 1 and 2 are placed in a conductive state, and the variable resistance element 5 changes its resistance state to a low-resistance state (LR state is written). In this way, data is written (LR state is written) to the variable resistance element 5. On the other hand, when a voltage in which electric potential of the first electrode 1 is lower than that of the second electrode 2, is applied, the metal element is converted into the ions, which are drawn toward the electrode 1 and migrate away from the insulator layer 4. This causes an increase in a degree of insulativity between the upper and lower electrodes 1 and 2. As a result, the variable resistance element 5 change its resistance state to the high-resistance state (HR state is written). In this way, the data is erased from (HR state is written to) the variable resistance element 5.

Figure 16A:
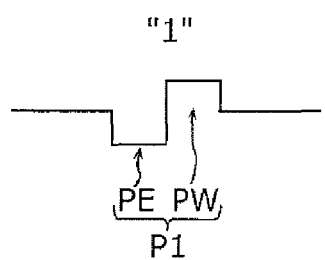
FIG. 16A is a pulse waveform diagram in a case where writing is performed in a prior art.
Figure 16B:
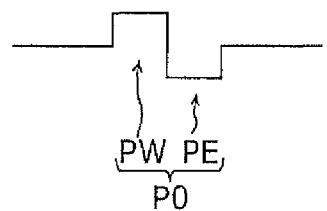
FIG. 16B is a pulse waveform diagram in a case where erasing is performed in the prior art.

FIGS. 16A and 16B are waveform diagrams of the voltage pulse applied to the variable resistance element 5 in a case where data is stored once.

FIG. 16A shows the pulse waveform in a case where writing (storing of data "1") is performed. In this example, an erase voltage pulse PE is firstly applied as a voltage pulse with an opposite polarity, and then a voltage pulse PW with a polarity corresponding to information to be stored is applied. In other words, a set of the two voltage pulses PE and PW is a voltage pulse P1 used to store the information "1".

FIG. 16B shows the pulse waveform in a case where erasing (storing of data "0") is performed. In this example, a write voltage pulse PW is firstly applied as a voltage pulse with an opposite polarity, and then a voltage pulse PE with a polarity corresponding to information to be stored is applied. In other words, a set of the two voltage pulses PW and PE is a voltage pulse P0 used to store the information "0".

By storing the data in the variable resistance element 5 using the voltage pulses P1 and P0 shown in FIGS. 16A and 16B, respectively, the number of times the voltage pulse PW or PE with the same polarity is successive is limited to twice or less. This makes it possible to suppress a change (change from the LR state toward the HR state, change from the HR state toward the LR state) in the resistance value of the variable resistance element 5, which is caused by successively applying the voltage pulse PW or PE with the same polarity many times. As a result, life which can withstand rewriting can be extended.

In summary of the technique described in the background art, I. G. Baek et al., IEDM2004 discloses that some of the transition metal oxides exhibit a reversible and non-volatile resistance changing phenomenon by application of the electric pulse, and it is necessary to apply in advance a voltage with a greater absolute value than the voltage applied to cause the reversible resistance change after the transition metal oxide is placed in a state in which the resistance changing phenomenon can take place, in order to place the transition metal oxide in this state. Hereinafter, throughout the specification, the operation (operation including the above stated forming) for applying such a voltage will be referred to as initial break, and the voltage applied during the initial break will be referred to as an initial break voltage.

I. G. Baek et al., IEDM2004 discloses that a mechanism of the initial break can be described using a model that forms a conductive path which enables the reversible resistance change in the transition metal oxide in a very high resistance state which is close to an initial insulating state.

JP2007-4935A discloses a data storing method, in which life of the variable resistance element which can withstand rewriting can be extended by applying the voltage with an opposite polarity to the variable resistance element before the voltage with a polarity corresponding to the information to be stored is applied to the variable resistance element every time the data is stored in variable resistance element.

It is expected that by using the variable resistance element as the memory cell, a highly reliable memory can be implemented as compared to a generally known non-volatile memory, for example, a flash memory, and the like.

[Finding Attained by the Inventors]

In light of the above mentioned disclosure, the inventors are studying a variable resistance non-volatile memory device in which a memory cell includes a variable resistance layer comprising an oxygen-deficient oxide (e.g., tantalum oxide) of tantalum (Ta) which is one of the transition metals, and a switching element, as one of variable resistance non-volatile memory devices.

As defined herein, the oxygen-deficient oxide refers to an oxide in which oxygen is deficient with respect to a stoichiometric composition.

Now, to preliminarily explain the problem to be solved, a description will be given of several characteristics of the variable resistance element including the variable resistance layer comprising an oxygen-deficient Ta oxide ($TaO_x$, $0<x<2.5$), which are obtained from experiments. The details are disclosed in WO2008/149484 and WO2009/050833 which are the associated patents.

Figure 17:
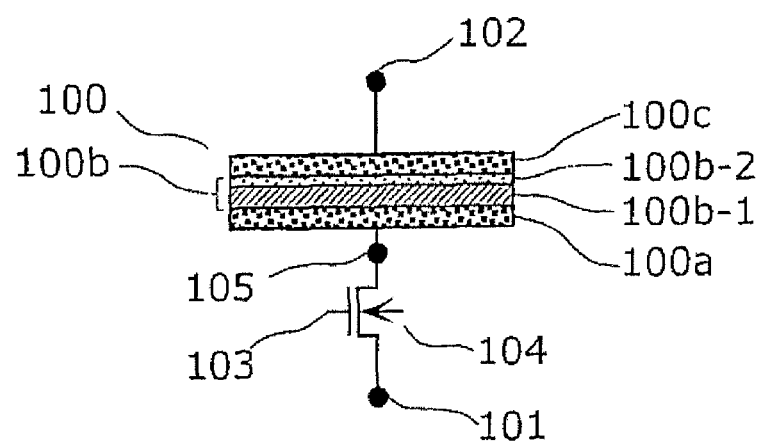
FIG. 17 is a schematic view showing a configuration of a 1T1R memory cell including the conventional variable resistance element.

FIG. 17 is a schematic view showing a configuration (configuration of 1 bit) of a 1T1R memory cell including the conventional variable resistance element. As shown in FIG.

17, the 1T1R memory cell typically includes a NMOS transistor 104 and a variable resistance element 100.

As shown in FIG. 17, the variable resistance element 100 includes a lower electrode 100a, a variable resistance layer 100b including a first metal oxide layer (in this example, first tantalum oxide layer ($TaO_x$, $0<x<2.5$)) 100b-1 which comprises an oxygen-deficient transition metal oxide and is lower in resistance, and a second metal oxide layer (in this example, second tantalum oxide layer ($TaO_y$, $x<y$)) 100b-2 which is higher in resistance such that the first metal oxide layer and the second metal oxide layer are stacked together, and an upper electrode 100c such that the lower electrode 100a, the variable resistance layer 100b and the upper electrode 100c are stacked together. A lower electrode terminal 105 is drawn from the lower electrode 100a, while an upper electrode terminal 102 is drawn from the upper electrode 100c.

A NMOS transistor 104 which is a select transistor (i.e., example of switching element) includes a gate terminal 103. The lower electrode terminal 105 of the variable resistance element 100 and the source or drain ($N^+$ diffusion) region of the NMOS transistor 104 are connected in series, while the other of the source or drain ($N^+$ diffusion) region which is not connected to the variable resistance element 100 is drawn as the lower electrode terminal 101. A substrate terminal of the NMOS transistor 104 is electrically grounded. In this example, the second metal oxide layer 100b-2 which is higher in resistance is placed at the upper electrode terminal 102 side which is the opposite side of the NMOS transistor 104.

As the material of the upper electrode 100c, as disclosed in the above stated WO2009/050833 which is the relating patent, for example, Pt (platinum), Ir (iridium), Pd (palladium), Ag (silver), Ni (nickel), W (tungsten), Cu (copper), etc., may be used.

WO2009/050833 discloses that in a case where the upper electrode 100c comprises an electrode material which is higher in standard electrode potential than Ta which is a constituent of the variable resistance layer 100b, resistance change takes place easily in a region of the variable resistance layer 100b which is in the vicinity of the interface between the variable resistance layer 100b and the upper electrode 100c, the resistance change takes place more easily when a difference in standard electrode potential between the electrode material constituting the upper electrode 100c and the metal constituting the variable resistance layer 100b is greater, and the resistance change takes place less easily when the difference in standard electrode potential between the electrode material constituting the upper electrode 100c and the metal constituting the variable resistance layer 100b is smaller. Patent Literature 3 also discloses that the resistance change takes place less easily when the upper electrode 100c comprises an electrode material which is lower in standard electrode potential than Ta which is the constituent of the variable resistance layer 100b.

The standard electrode potential is an indicator which indicates that oxidation occurs less easily. The standard electrode potential is a characteristic in which as its value is greater, the corresponding material is less easily oxidized, while as its value is smaller, the corresponding material is more easily oxidized. Especially, it is desirable to use Pt or Ir which is higher in standard electrode potential, as the electrode material, for attaining a good resistance changing operation.

In the memory cell of FIG. 17, when a voltage (low-resistance state writing voltage) pulse which is equal to greater than a predetermined positive voltage (e.g., first threshold voltage) is applied to the lower electrode terminal 101 on the basis of the upper electrode terminal 102, a reduction reaction occurs in the region of the variable resistance layer 100b which is in the vicinity of the interface between the variable resistance layer 100b and the upper electrode 100c, so that the variable resistance element 100 switches to the low-resistance state. On the other hand, when a voltage (high-resistance state writing voltage) pulse which is equal to greater than another predetermined positive voltage (e.g., second threshold voltage) is applied to the upper electrode terminal 102 on the basis of the lower electrode terminal 101, an oxidation reaction occurs in the region of the variable resistance layer 100b which is in the vicinity of the interface between the variable resistance layer 100b and the upper electrode 100c, so that the variable resistance element 100 switches to the high-resistance state. Hereinafter, the direction in which the low-resistance state writing voltage pulse is applied will be referred to as a negative voltage direction, while the direction in which the high-resistance state writing voltage pulse is applied will be referred to as a positive voltage direction.

However, in the memory cell including the above stated variable resistance element, when the high-resistance state writing voltage pulse (once) and the low-resistance state writing voltage pulse (once) are applied alternately in repetition, the resistance changing operation occurs stably in an initial period of rewriting, but the resistance change state becomes unstable as the number of times of the rewriting is increased. In other words, the inventors found out a phenomenon ("LR frozen state") in which the low-resistance state does not switch to the high-resistance state even though the high-resistance state writing voltage pulse is applied.

The inventors studied intensively to solve the above described problem, and as a result, discovered that by applying at least once to the variable-resistance non-volatile memory element a recovery voltage pulse set composed of two pulses which are a first recovery voltage pulse which has the same polarity as that of the first voltage (LR state writing voltage) and a second recovery voltage pulse which has the same polarity as that of the second voltage (HR state writing voltage), has a greater amplitude than the second voltage, and is applied subsequently to the first recovery voltage pulse, the element can be recovered from the "LR frozen state" to a state in which the normal resistance changing operation can take place. As a result, the inventors conceived a writing method of a variable resistance non-volatile memory element, and a variable resistance non-volatile memory device, as will be described below.

Hereinafter, embodiments of the present disclosure will be described with reference to the attached drawings.

The embodiments described hereinafter are preferred specific examples of the present disclosure. Numeric values, shapes, materials, constituents (elements), layout positions of the constituents, connection form of the constituents, steps, the order of the steps, etc., which are illustrated in the embodiments described below, are merely exemplary, and are not intended to limit the present disclosure. Also, among the constituents in the embodiments described below, the constituents which are not recited in independent claims defining a broadest concept of the present disclosure will be described as arbitrary constituents constituting a more desirable embodiment. Description of the constituents designated by the same reference symbols in the drawings will be sometimes omitted. For easier understanding, in the drawings, the constituents are schematically shown, and their shapes, dimension ratio, etc., are not sometimes accurate. Moreover, in a manufacturing method, the order of the steps, etc., can be changed and other known steps may be added as necessary.

Embodiment 1

According to Embodiment 1, there is provided a writing method of a variable resistance non-volatile memory element, in which a voltage pulse is applied to the variable resistance non-volatile memory element to reversibly change a resistance state of the variable resistance non-volatile memory element, the variable resistance non-volatile memory element including a first electrode, a second electrode, and a variable resistance layer sandwiched between the first electrode and the second electrode; the variable resistance layer including a first metal oxide layer which is in contact with the first electrode, and a second metal oxide layer which is in contact with the second electrode and is lower in degree of oxygen deficiency than the first metal oxide layer; the variable resistance non-volatile memory element having a characteristic in which the variable resistance non-volatile memory element changes the resistance state from a first resistance state used to store first information to a second resistance state used to store second information by application of a pulse of a first voltage, and changes the resistance state from the second resistance state to the first resistance state by application of a pulse of a second voltage which is different in polarity from the first voltage; the writing method comprising: determining, in a first determination step, whether or not the resistance state of the variable resistance non-volatile memory element does not switch to the first resistance state and remains in the second resistance state, when the pulse of the second voltage is applied to the variable resistance non-volatile memory element; and when it is determined that the resistance state of the variable resistance non-volatile memory element does not switch to the first resistance state and remains in the second resistance state in the first determination step, applying, in a recovery step, at least once to the variable-resistance non-volatile memory element a recovery voltage pulse set composed of two pulses which are a first recovery voltage pulse which has the same polarity as that of the first voltage and a second recovery voltage pulse which has the same polarity as that of the second voltage, has a greater amplitude than the second voltage, and is applied subsequently to the first recovery voltage pulse.

In this method, even when the problem associated with the resistance change, such as "LR frozen state" occurs, the recovery voltage pulse set is applied to the variable resistance non-volatile memory element at least once, and thereby the problem can be resolved. Therefore, it becomes possible to ensure a proper operation window even when the number of times of rewriting in the variable non-volatile memory element increases. As a result, it becomes possible to stably continue a resistance changing operation, and significantly improve reliability of the non-volatile memory device.

The above writing method may further comprising determining, in a second determination step, whether or not the resistance state of the variable resistance non-volatile memory element has switched to the first resistance state by application of the recovery voltage pulse set; and repeating application of the recovery voltage pulse set in the recovery step and determination in the second determination step.

In this method, since the recovery step is repeated until the problem associated with the resistance change has been resolved, the problem associated with the resistance change, such as "LR frozen state", can be resolved surely.

In the above writing method, the second recovery voltage pulse may have a longer pulse width than the pulse of the second voltage.

In this method, even when the problem associated with the resistance change, such as "LR frozen state" in a severe level, occurs, the recovery voltage pulse set including the second recovery voltage pulse having a longer pulse width is applied to the variable resistance non-volatile memory element at least once, and thereby, the problem can be resolved. Therefore, it becomes possible to ensure a proper operation window even when the number of times of rewriting in the non-volatile memory element increases. As a result, it becomes possible to stably continue a resistance changing operation, and more significantly improve reliability of the variable non-volatile memory device.

The above writing method may comprise when the resistance state of the variable resistance non-volatile memory element does not switch to the first resistance state, after application of the recovery voltage pulse set in the recovery step and determination in the second determination step are repeated predetermined number of times, converting the second recovery voltage pulse into a new second recovery voltage pulse having a longer pulse width than the second recovery voltage pulse, and then applying the recovery voltage pulse set to the variable resistance non-volatile memory element at least once in the recovery step.

In this method, when the resistance state of the variable resistance non-volatile memory element does not change even after the recovery voltage pulse set is applied to the variable resistance non-volatile memory element, the recovery step is executed by increasing the pulse width of the second recovery voltage pulse. Therefore, the problem associated with the resistance change, such as "LR frozen state", can be resolved more surely.

The above writing method may comprise when the resistance state of the variable resistance non-volatile memory element does not switch to the first resistance state, after application of the recovery voltage pulse set in the recovery step and determination in the second determination step are repeated predetermined number of times, repeating an additional recovery process until the resistance state of the variable resistance non-volatile memory element has switched to the first resistance state, the additional recovery process including converting the second recovery voltage pulse into a new second recovery voltage pulse having a longer pulse width than the second recovery voltage pulse and repeating predetermined number of times, application of the recovery voltage pulse set in the recovery step and determination in the second determination step.

The additional recovery process is defined as a process in which the second recovery voltage pulse is converted into the new second recovery voltage pulse having a longer width, and then application of the recovery voltage pulse set in the recovery step and determination in the second determination step are repeated predetermined number of times.

In a case where the resistance state of the variable resistance non-volatile memory element does not switch to the first resistance state even after the additional recovery step is repeated predetermined number of times, the second recovery voltage pulse is converted into the new second recovery voltage pulse having a longer pulse width, and in this state, the new additional recovery process is repeated. In the same manner, the additional recovery process is repeated while increasing the pulse width, until the resistance state of the variable resistance non-volatile memory element has switched to the first resistance state. The predetermined number of times may be varied for each pulse width of the second recovery voltage pulse.

In this method, when the resistance state of the variable resistance non-volatile memory element does not change even after the recovery voltage pulse set is applied, the problem associated with the resistance change, such as "LR frozen state" in a severer level, can be resolved by increasing the pulse width of the second recovery voltage pulse until the problem associated with the resistance change has been resolved.

In the above writing method, the new second recovery voltage pulse may have a greater amplitude than the second recovery voltage pulse before conversion.

In this method, the problem associated with the resistance change, such as "LR frozen state" in a severer level, can be resolved with a higher probability.

In the above writing method, the first metal oxide layer may have a composition expressed as $TaO_x$; and the second metal oxide layer may have a composition expressed as $TaO_y$ ($x<y$).

In the above writing method, the variable resistance non-volatile memory element may reversibly switch the resistance state between a high-resistance state and a low-resistance state; the first resistance state may be the high-resistance state; and the second resistance state may be the low-resistance state.

In the above writing method, the first recovery voltage pulse may have an amplitude which is equal to or less than an amplitude of the pulse of the first voltage.

In the above writing method, the first recovery voltage pulse may have an amplitude which is about as great as an amplitude of the pulse of the first voltage.

According to Embodiment 1, there is provided a variable resistance non-volatile memory device comprising: a memory cell including a variable resistance non-volatile memory element and a switching element which are connected in series; and a drive circuit for driving the memory cell, the variable resistance non-volatile memory element including a first electrode, a second electrode, and a variable resistance layer sandwiched between the first electrode and the second electrode; the variable resistance layer including a first metal oxide layer which is in contact with the first electrode, and a second metal oxide layer which is in contact with the second electrode and is lower in degree of oxygen deficiency than the first metal oxide layer; the variable resistance non-volatile memory element having a characteristic in which the variable resistance non-volatile memory element changes the resistance state from a first resistance state used to store first information to a second resistance state used to store second information by application of a pulse of a first voltage, and changes the resistance state from the second resistance state to the first resistance state by application of a pulse of a second voltage which is different in polarity from the first voltage; the drive circuit including: a write circuit for writing information to the memory cell; a sense amplifier for reading the information from the memory cell; and a control circuit for determining using the sense amplifier, in a first determination step, whether or not the resistance state of the variable resistance non-volatile memory element does not switch to the first resistance state and remains in the second resistance state, when the pulse of the second voltage is applied to the variable resistance non-volatile memory element by the write circuit; the control circuit being configured to control the write circuit in such a manner that, when the control circuit determines that the resistance state of the variable resistance non-volatile memory element does not switch to the first resistance state and remains in the second resistance state in the first determination step, the control circuit performs a recovery step of causing the write circuit to apply at least once to the variable-resistance non-volatile memory element a recovery voltage pulse set composed of two pulses which are a first recovery voltage pulse which has the same polarity as that of the first voltage and a second recovery voltage pulse which has the same polarity as that of the second voltage, has a greater amplitude than the second voltage, and is applied subsequently to the first recovery voltage pulse.

In this configuration, even when a problem associated with the resistance change, such as "LR frozen state" occurs, the recovery voltage pulse set is applied to the variable resistance non-volatile memory element at least once, and thereby the problem can be resolved. Therefore, it becomes possible to ensure a proper operation window even when the number of times of rewriting in the variable resistance non-volatile memory element increases. As a result, it becomes possible to stably continue a resistance changing operation, and significantly improve reliability of the non-volatile memory device.

In the above variable resistance non-volatile memory device, the control circuit may be configured to further perform a second determination step of determining using the sense amplifier, whether or not the resistance state of the variable resistance non-volatile memory element has switched to the first resistance state by application of the recovery voltage pulse set, and repeat application of the recovery voltage pulse set in the recovery step and determination in the second determination step until the resistance state of the variable resistance non-volatile memory element has switched to the first resistance state.

In this configuration, since the recovery step is repeated until the problem associated with the resistance change has been resolved, the problem associated with the resistance change, such as "LR frozen state", can be resolved surely.

In the above variable resistance non-volatile memory device, the second recovery voltage pulse may have a longer pulse width than the pulse of the second voltage.

In this configuration, even when the problem associated with the resistance change, such as "LR frozen state" in a severe level, occurs, the recovery voltage pulse set including the second recovery voltage pulse having a longer pulse width is applied to the variable resistance non-volatile memory element at least once, and therefore, the problem can be resolved. Therefore, it becomes possible to ensure a proper operation window even when the number of times of rewriting in the variable resistance non-volatile memory element increases. As a result, it becomes possible to stably continue a resistance changing operation, and more significantly improve reliability of the non-volatile memory device.

In the above variable resistance non-volatile memory device, the control circuit may be configured to convert the second recovery voltage pulse into a new second recovery voltage pulse having a longer pulse width than the second recovery voltage pulse, and then apply the recovery voltage pulse set to the variable resistance non-volatile memory element at least once in the recovery step, when the resistance state of the variable resistance non-volatile memory element does not switch to the first resistance state, after the control circuit has repeated predetermined number of times application of the recovery voltage pulse set in the recovery step and determination in the second determination step.

In this configuration, when the resistance state of the variable resistance non-volatile memory element does not change even after the recovery voltage pulse set is applied to the variable resistance non-volatile memory element, the recovery step is executed by increasing the pulse width of the second recovery voltage pulse. Therefore, the problem associated with the resistance change, such as "LR frozen state", can be resolved more surely.

In the above variable resistance non-volatile memory device, the control circuit may be configured to repeat an additional recovery process until the resistance state of the variable resistance non-volatile memory element has switched to the first resistance state, the additional recovery process including converting the second recovery voltage pulse into a new second recovery voltage pulse having a longer pulse width than the second recovery voltage pulse, and repeating predetermined number of times, application of the recovery voltage pulse set in the recovery step and determination in the second determination step, when the resistance state of the variable resistance non-volatile memory element does not switch to the first resistance state, after the control circuit has repeated predetermined number of times application of the recovery voltage pulse set in the recovery step and determination in the second determination step.

The additional recovery process is defined as a process in which the second recovery voltage pulse is converted into the new second recovery voltage pulse having a longer pulse width, and then application of the recovery voltage pulse set in the recovery step and determination in the second determination step are repeated predetermined number of times.

In a case where the resistance state of the variable resistance non-volatile memory element does not switch to the first resistance state even after the additional recovery step is repeated predetermined number of times, the second recovery voltage pulse is converted into a new second recovery voltage pulse having a longer pulse width, and in this state, the new additional recovery process is repeated predetermined number of times. In the same manner, the additional recovery process is repeated while increasing the pulse width until the resistance state of the variable resistance non-volatile memory element has switched to the first resistance state. The predetermined number of times may be varied for each pulse width of the second recovery voltage pulse.

In configuration, when the resistance state of the variable resistance non-volatile memory element does not change even after the recovery voltage pulse set is applied, the problem associated with the resistance change, such as "LR frozen state" in a severer level, can be resolved by increasing the pulse width of the second recovery voltage pulse until the problem associated with the resistance change has been resolved.

In the above variable resistance non-volatile memory device, the new second recovery voltage pulse may have a greater amplitude than the second recovery voltage pulse before conversion.

In this configuration, the problem associated with the resistance change, such as "LR frozen state" in a severer level, can be resolved with a higher probability.

In the above variable resistance non-volatile memory device, the first metal oxide layer may have a composition expressed as $TaO_x$; and the second metal oxide layer may have a composition expressed as $TaO_y$ (x<y).

In the above variable resistance non-volatile memory device, the variable resistance non-volatile memory element may reversibly switch the resistance state between the high-resistance and the low-resistance state; the first resistance state may be the high-resistance state; and the second resistance state may be the low-resistance state.

In the above variable resistance non-volatile memory device, the first recovery voltage pulse may have an amplitude which is equal to or less than an amplitude of the pulse of the first voltage.

In the above variable resistance non-volatile memory device, the first recovery voltage pulse may have an amplitude which is about as great as an amplitude of the pulse of the first voltage.

In the above variable resistance non-volatile memory device, the switching element may be a MOS transistor.

In the above variable resistance non-volatile memory device, the switching element may be a bidirectional diode.

[Detailed Description of Problem]

Now, the problem to be solved by the present embodiment will be described in greater detail.

First of all, a description will be given of the resistance changing characteristic of the 1T1R memory cell incorporating the variable resistance element 100 of FIG. 17, including the upper electrode 100c comprising Ir (iridium), the lower electrode 100a comprising TaN (tantalum nitride), and the variable resistance layer 100b including the first metal oxide layer (in this example, first tantalum oxide layer ($TaO_x$, 0<x<2.5)) 100b-1, and the second metal oxide layer (in this example, second tantalum oxide layer ($TaO_y$, x<y)) 100b-2, and a detailed description of the problem associated with the resistance changing characteristic.

The variable resistance layer 100b is interposed between the upper electrode 100c (second electrode) and the lower electrode 100a (first electrode) and reversibly changes its resistance value in response to the electric signal applied between the upper electrode 100c and the lower electrode 100a. For example, the variable resistance layer 100b reversibly switches its resistance state between the low-resistance state and the high-resistance state according to the polarity of the voltage applied between the upper electrode 100c and the lower electrode 100a. The variable resistance layer 100b includes at least two layers which are a second variable resistance layer connected to the upper electrode 100c and a first variable resistance layer connected to the lower electrode 100a.

The first metal oxide layer 100b-1 (first variable resistance layer) comprises an oxygen-deficient first metal oxide, while the second metal oxide layer 100b-2 (second variable resistance layer) comprises a second metal oxide which is lower in degree of oxygen deficiency than the first metal oxide. A minute localized region which reversibly changes the degree of oxygen deficiency by application of the electric pulse is formed in the second variable resistance layer of the variable resistance element. It is considered that the localized region contains a filament formed by oxygen vacancy sites.

A sample configuration used in the experiment is such that the variable resistance layer 100b has an area of 0.25 μm² (=0.5 μm×0.5 μm), and has the first metal oxide layer 100b-1 (in this example, $TaO_x$: x=1.54, thickness: 30 nm) which in contact with the lower electrode 100a, and the second metal oxide layer 100b-2 (in this example, $TaO_y$: y=2.47, thickness: 6.5 nm) which is in contact with the upper electrode 100c. The NMOS transistor 104 which is the switching element is such that a gate width W is 0.44 μm, a gate length L is 0.18 μm, and a gate insulating layer thickness Tox is 3.5 nm.

The second metal oxide layer 100b-2 (in this example, $TaO_y$) is deposited on the first metal oxide layer 100b-1 (in this example, $TaO_x$) deposited by sputtering, before a manufacturing step of the upper electrode 100c, and is lower in degree of oxygen deficiency than the first metal oxide layer 100b-1 (in this example, $TaO_x$), i.e., has a resistance value (>1MΩ) which is much greater than that of the first metal oxide layer 100b-1. To allow the element to perform the resistance changing operation, it is necessary to initially apply the initial break voltage for a specified time, to form the conductive path in the second metal oxide layer 100b-2.

The term "degree of oxygen deficiency" refers to a ratio of an amount of oxygen which is deficient with respect to an amount of oxygen constituting an oxide having a stoichiometric composition (stoichiometric composition corresponding to a greatest resistance value in a case where there exist plural stoichiometric compositions) of each metal oxide. A metal oxide having a stoichiometric composition is more stable and has a greater resistance value than a metal oxide having another composition.

For example, in a case where the metal is tantalum (Ta), a tantalum oxide having a stoichiometric composition according to the above definition is $Ta_2O_5$, and therefore is expressed as $TaO_{2.5}$. The degree of oxygen deficiency of $TaO_2O_5$ is 0%. The degree of oxygen deficiency of $TaO_{1.5}$, is (2.5−1.5)/2.5=40%. An oxygen excess metal oxide has a negative value in degree of oxygen deficiency. In the present specification, the degree of oxygen deficiency is meant to include a positive value, 0 and a negative value unless otherwise explicitly noted.

An oxide which is lower in degree of oxygen deficiency is closer to the oxide having a stoichiometric composition and therefore has a greater resistance value, while an oxide which is higher in degree of oxygen deficiency is closer to the metal constituting the oxide and therefore has a smaller resistance value.

The term "oxygen content atomic percentage" refers to a ratio of the number of oxygen atoms to the total number of atoms. For example, the oxygen content atomic percentage of $Ta_2O_5$ is the ratio of the number of oxygen atoms to the total number of atoms (O/(Ta+O)) and is 71.4 atm %. Therefore, the oxygen content atomic percentage of the oxygen-deficient tantalum oxide is higher than 0 and lower than 71.4 atm %. For example, in a case where the metal constituting the first metal oxide layer and the metal constituting the second metal oxide layer are of the same kind, there is a correspondence between the oxygen content atomic percentage and the degree of oxygen deficiency. In this case, when the oxygen content atomic percentage of the second metal oxide is higher than the oxygen content atomic percentage of the first metal oxide, the degree of oxygen deficiency of the second metal oxide is lower than the degree of oxygen deficiency of the first metal oxide.

As the metal constituting the variable resistance layer 100b, a metal other than tantalum may be used. As the metal constituting the variable resistance layer, a transition metal, or aluminum (Al) may be used. As the transition metal, tantalum (Ta), titanium (Ti), hafnium (Hf), zirconium (Zr), niobium (Nb), tungsten (W), nickel (Ni), etc., may be used. Since the transition metal can assume plural oxidized states, different resistance states can be implemented by the redox reaction.

When x of $HfO_x$ of the composition of the first metal oxide is equal to or greater than 0.9 and equal to or less than 1.6, and y of $HfO_y$ of the composition of the second metal oxide is greater than x, in a case where the hafnium oxide is used, the resistance value of the variable resistance layer is allowed to change stably and at a high speed. In this case, the thickness of the second metal oxide may be set to 3 to 4 nm.

When x of $ZrO_x$ of the composition of the first metal oxide is equal to or greater than 0.9 and equal to or less than 1.4, and y of $ZrO_y$ of the composition of the second metal oxide is greater than x, in a case where the zirconium oxide is used, the resistance value of the variable resistance layer is allowed to change stably and at a high speed. In this case, the thickness of the second metal oxide may be set to 1 to 5 nm.

The first metal constituting the first metal oxide and the second metal constituting the second metal oxide may be different metals. In this case, the second metal oxide may be lower in degree of oxygen deficiency than the first metal oxide, i.e., higher in resistance than the first metal oxide. In such a configuration, a greater portion of a voltage applied between the first electrode and the second electrode to cause resistance change is fed to the second metal oxide, and the redox reaction taking place within the second metal oxide is facilitated.

In a case where the first metal constituting the first metal oxide which will become the first variable resistance layer and the second metal constituting the second metal oxide which will become the second variable resistance layer are materials which are different from each other, the standard electrode potential of the second metal may be lower than the standard electrode potential of the first metal. The standard electrode potential is a characteristic in which as its value is greater, the corresponding material is less easily oxidized. This allows the redox reaction to take place more easily in the second metal oxide which is relatively lower in standard electrode potential. It is estimated that in a resistance changing phenomenon, the redox reaction takes place in the minute localized region formed within the second metal oxide which is higher in resistance, the filament (conductive path) changes, and thereby its resistance value (degree of oxygen deficiency) changes.

For example, a stable resistance changing operation is attained by using an oxygen-deficient tantalum oxide ($TaO_x$) as the first metal oxide and by using a titanium oxide ($TiO_2$) as the second metal oxide. Titanium (standard electrode potential=−1.63 eV) has a lower standard electrode potential than tantalum (standard electrode potential=−0.6 eV). By using as the second metal oxide an oxide of a metal having a lower standard electrode potential than the metal of the first metal oxide, the redox reaction easily takes place within the second metal oxide. As another combination, an aluminum oxide ($Al_2O_3$) may be used as the second metal oxide which will become the high-resistance layer. For example, an oxygen-deficient tantalum oxide ($TaO_x$) may be used as the first metal oxide, and the aluminum oxide ($Al_2O_3$) may be used as the second metal oxide.

It is estimated that in a resistance changing phenomenon in the variable resistance layer having the stacked-layer structure, the redox reaction takes place in the minute localized region formed within the second metal oxide which is higher in resistance, the filament (conductive path) in the localized region changes, and thereby its resistance value changes.

Specifically, when a positive voltage is applied to the upper electrode 100c (second electrode) connected to the second metal oxide on the basis of the lower electrode 100a (first electrode), oxygen ions within the variable resistance layer are drawn toward the second metal oxide. Thereby, an oxidation reaction proceeds in the minute localized region formed within the second metal oxide, and the degree of oxygen deficiency reduces. This may result in a situation in which connection of the filament in the localized region does not easily occur, and the resistance value increases.

Conversely, when a negative voltage is applied to the upper electrode 100c (second electrode) connected to the second metal oxide on the basis of the lower electrode 100a (first electrode), the oxygen ions within the second metal oxide are forced to migrate toward the first metal oxide. Thereby, a reduction reaction proceeds in the minute localized region formed within the second metal oxide, and the degree of oxygen deficiency increases. This may result in a situation in which connection of the filament in the localized region easily occurs, and the resistance value decreases.

The upper electrode 100c (second electrode) connected to the second metal oxide which is lower in degree of oxygen deficiency comprises a material which is higher in standard electrode potential than the metal constituting the second metal oxide and the material constituting the lower electrode 100a (first electrode), for example, platinum (Pt), iridium (Ir), and palladium (Pd). The lower electrode 100a (first electrode) connected to the first metal oxide which is higher in degree of oxygen deficiency may comprise for example, a material which is lower in standard electrode potential than the metal constituting the first metal oxide, such as tungsten (W), nickel (Ni), tantalum (Ta), titanium (Ti), aluminum (Al), a tantalum nitride (TaN), and a titanium nitride (TiN). The standard electrode potential is a characteristic in which as its value is greater, the corresponding material is less easily oxidized.

When a standard electrode potential of the upper electrode 100c (second electrode) is V2, a standard electrode potential of the metal constituting the second metal oxide is Vr2, a standard electrode potential of the metal constituting the first metal oxide is Vr1, and a standard electrode potential of the lower electrode 100a (first electrode) is V1, Vr2<V2 and V1<V2 may be satisfied. Furthermore, V2>Vr2 and Vr1≥V1 may be satisfied.

By the above described configuration, a redox reaction takes place selectively in a region within the second metal oxide which is in the vicinity of the interface between the second electrode and the second metal oxide, and hence a stable resistance changing phenomenon is attained.

In a case where the variable resistance element 100 configured as described above is activated, a voltage which satisfies a predetermined condition is applied between the lower electrode 100a and the upper electrode 100c, by an outside power supply.

Figure 1A:
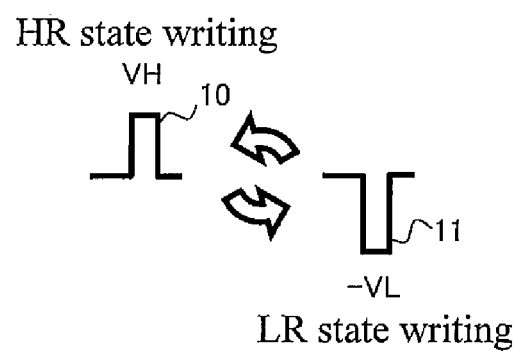
FIG. 1A is a schematic view of a pulse waveform in a case where a high-resistance (HR) state writing voltage pulse (one pulse) and a low-resistance (LR) state writing voltage pulse (one pulse) are applied alternately in repetition.
Figure 1B:
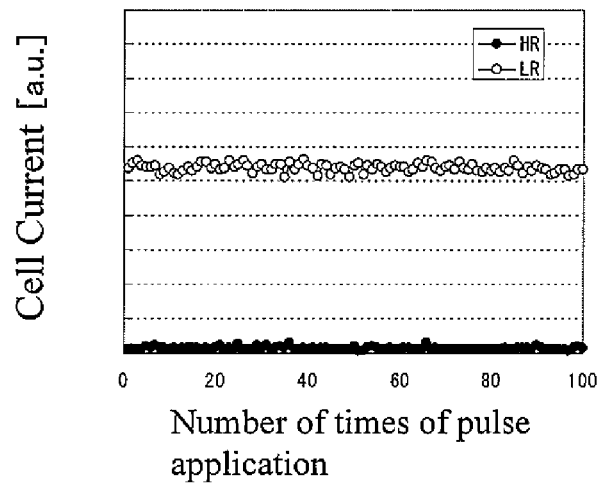
FIG. 1B is a view showing a normal resistance changing characteristic in a case where the high-resistance state writing voltage pulse and the low-resistance state writing voltage pulse of FIG. 1A are applied alternately in repetition.
Figure 1C:
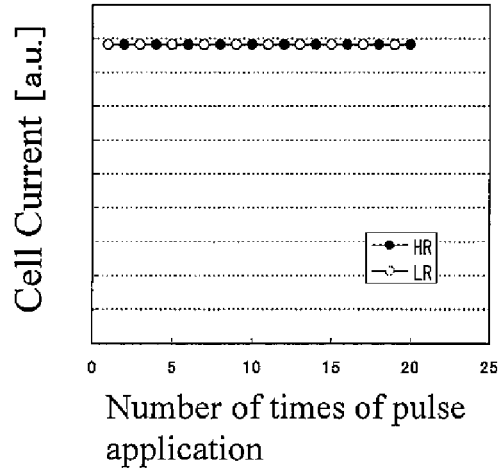
FIG. 1C is a view showing an abnormal resistance changing characteristic in a case where a problem called "low-resistance (LR) frozen state" occurs.

FIG. 1B shows an exemplary normal resistance changing characteristic in a case where a high-resistance (HR) state writing voltage pulse 10 (voltage: VH, pulse width: 50 ns) and a low-resistance (LR) state writing voltage pulse 11 (voltage: −VL, pulse width: 50 ns) of FIG. 1A are applied alternately plural times in repetition between the lower electrode terminal 101 and the upper electrode terminal 102, in the 1T1R memory cell including the variable resistance element of FIG. 17 configured as described above. FIG. 1C shows an exemplary abnormal resistance changing characteristic in a case where "low-resistance (LR) frozen state" occurs. The term "low-resistance (LR) frozen state" refers to a phenomenon (problem) in which the resistance state of the variable resistance element does not switch to the high-resistance (HR) state even though the HR state writing voltage pulse is applied to the variable resistance element in the low-resistance (LR) state (the variable resistance element remains in the LR state without switching to the HR state).

A symbol affixed to each voltage pulse represents a voltage value of the voltage pulse. Hereinafter, the voltage value of the voltage pulse will be expressed in the same manner. Also, the high-resistance and the low-resistance will be expressed as HR and LR, respectively, in some cases, so long as clarity of them is not lessened. In FIG. 1A, the high-resistance (HR) state writing voltage pulse 10 and the low-resistance (LR) state writing voltage pulse 11 are simply expressed as HR state writing and LR state writing, respectively.

It is supposed that a case where the positive voltage is applied to the upper electrode terminal 102 with respect to the lower electrode terminal 101 will be referred to as a case where a positive voltage is applied, while a reverse case will be referred to as a case where a negative voltage is applied. During application of the HR state writing voltage pulse 10 (voltage: VH) and the LR state writing voltage pulse 11 (voltage: −VL), for example, a positive gate voltage VL which is equal in absolute value to LR state writing voltage pulse 11, is applied to the gate terminal 103 of the NMOS transistor 104, so that the NMOS transistor 104 is placed in a conductive state.

When the HR state writing voltage pulse 10 (voltage: VH) is applied between the lower electrode terminal 101 and the upper electrode terminal 102 in the memory cell, almost all of the voltage VH is applied between both ends of the variable resistance element 100. However, when the LR state writing voltage pulse 11 (voltage: −VL) is applied between the lower electrode terminal 101 and the upper electrode terminal 102 in the memory cell, the voltage applied between the both ends of the variable resistance element 100 is −(VL−Vth), which is smaller by a threshold voltage Vth of the NMOS transistor 104. This is because the NMOS transistor 104 is placed in source follower connection during application of the LR state writing voltage pulse 11 (voltage: −VL).

In FIGS. 1B and 1C, a vertical axis indicates cell currents (currents flowing through the variable resistance element 100) corresponding to the HR state and the LR state, respectively (at this time, almost all of the voltage Vread is applied to the variable resistance element 100), when the positive gate voltage VG is applied to the gate terminal 103 in the memory cell of FIG. 17 and a positive read voltage Vread is applied to the upper electrode terminal 102 in the memory cell of FIG. 17 (at this time, a ground voltage is applied to the lower electrode terminal 101), while a horizontal axis indicates the number of times of application of the pulse. In this case, the resistance change does not take place when the voltage Vread is applied.

FIGS. 1B and 1C show the exemplary resistance changing characteristic in a case where the positive voltage VH of a specified pulse width is applied between the lower electrode terminal 101 and the upper electrode terminal 102, as the HR state writing voltage pulse 10, and the negative voltage −VL of a specified pulse width is applied between the lower electrode terminal 101 and the upper electrode terminal 102 as the LR state writing voltage pulse 11, as shown in FIG. 1A. At this time, the gate voltage VL is applied to the gate terminal 103. In addition, VL>VH is satisfied. Since the NMOS transistor 104 is placed in the source follower connection when the resistance state changes to the LR state, the voltage which is actually fed to the variable resistance element is such that the voltage VH fed to change the variable resistance element to the HR state is greater than the voltage (VL−Vth) fed to change the variable resistance element to the LR state.

As shown in FIG. 1B, in the normal resistance changing operation, the cell current corresponding to the HR state has an almost fixed value within a relatively narrow range, and the cell current corresponding to the LR state has an almost fixed value within a relatively narrow range. However, as shown in FIG. 1C, once the "LR frozen state", i.e., problem that the variable resistance element is stuck in the LR state occurs (the variable resistance element changes to the LR state by application of the LR state writing voltage pulse and thereafter does not switch to the HR state, even though the HR state writing voltage pulse is applied), the variable resistance element is stuck in the LR state and is not recovered, even when the HR state writing voltage pulse 10 (voltage: VH) and the LR state writing voltage pulse 11 (voltage: −VL) of FIG. 1A, which pulses are used in the normal operation, are applied alternately in repetition.

It is estimated that a cause of the above stated "LR frozen state" is that the oxygen ions are unexpectedly released in excess as compared to the normal LR state, during application of the LR state writing voltage pulse to the conductive path formed by the initial break. Once the "LR frozen state" occurs, the variable resistance element is not easily recovered from the state of "LR frozen state" by application of the normal HR state writing voltage pulse, and hence the number of times of rewriting (life which can withstand rewriting) becomes short. This is the finding.

[Basic Data Relating to Recovery from State of "LR Frozen State" to HR State Writing According to the Present Disclosure]

In view of the above mentioned circumstances, the inventors intensively studied a writing method of a variable resistance non-volatile memory element, which can resolve "LR frozen state", i.e., problem that the variable resistance element is stuck in the LR state (this resolution will be referred to as "recovery to HR state writing" or simply referred to as "recovery"). As a result, the inventors discovered that by applying a recovery voltage pulse set to the variable resistance element in such a manner that a LR state writing voltage pulse is firstly applied to the variable resistance element and then a HR state writing voltage pulse having a greater amplitude than the normal HR state writing voltage pulse is applied to the variable resistance element, the oxygen ions having been released in excess from the conductive path can be filled for makeup, and the function of the conductive path can be recovered, i.e., "LR frozen state" can be resolved.

Hereinafter, basic data relating to the recovery from the state of "LR frozen state" to HR state writing will be described, and then a specific configuration of the embodiment will be described.

(1) Example of Recovery to HR State Writing Implemented by Recovery of Function of Conductive Path (Example of "Recovery Step")

Now, a description will be given of "recovery of function of conductive path" which is a method of the recovery from the state of "LR frozen state".

The recovery step is one of the writing method which reversibly changes the resistance state of the variable resistance non-volatile memory element by applying the voltage pulse to the variable resistance non-volatile memory element.

The variable resistance non-volatile memory element (e.g., variable resistance element 100) includes a first electrode (e.g., lower electrode 100a), a second electrode (e.g., upper electrode 100c), and a variable resistance layer (e.g., variable resistance layer 100b) interposed between the first electrode and the second electrode, and the variable resistance layer includes the first metal oxide layer (e.g., first metal oxide layer 100b-1) which is in contact with the first electrode, and a second metal oxide layer (e.g., second metal oxide layer 100b-2) which is in contact with the second electrode and is lower in degree of oxygen deficiency than the first metal oxide layer. The variable resistance non-volatile memory element has a characteristic in which it changes the resistance state from a first resistance state (e.g., HR) used to store first information (e.g., "0") to a second resistance state (e.g., LR) used to store second information (e.g., "1"), by application of a first voltage (e.g., −VL) pulse (low-resistance state writing voltage pulse, LR state writing voltage pulse), and it changes the resistance state from the second resistance state (e.g., LR) to the first resistance state (e.g., VH), by application of a second voltage (e.g., VH) pulse (high-resistance state writing voltage pulse, HR state writing voltage pulse) which is different in polarity from the first voltage.

In the recovery step, the following step is performed. In a first determination step of determining whether or not the resistance state of the variable resistance non-volatile memory element cannot switch to the first resistance state (e.g., HR) and remains (is stuck) in the second resistance state (e.g., LR) (e.g., "LR frozen state" occurs), when the second voltage (e.g., VH) pulse is applied to the variable resistance non-volatile memory element, when it is determined that the resistance state of the variable resistance non-volatile memory element cannot switch to the first resistance state (e.g., HR) and remains (is stuck) in the second resistance state (e.g., LR), a recovery voltage pulse set is applied to the variable resistance non-volatile memory element at least once, the recovery voltage pulse set being composed of two pulses which are (1) a first recovery voltage (e.g., negative voltage) pulse which has the same polarity as that of the first voltage (e.g., −VL), and (2) a second recovery voltage (e.g., positive voltage) pulse which has the same polarity as that of the second voltage (e.g., VH), has a greater amplitude than the second voltage (e.g., VH), and is applied subsequently to the first recovery voltage.

The first recovery voltage pulse has the same polarity as that of the first voltage. The amplitude of the first recovery voltage pulse may be about as great as that of the first voltage pulse (equal to or greater than 80% of that of the first voltage pulse and equal to or less than 120% of that of the first voltage pulse), may be substantially equal to that of the first voltage pulse (equal to or greater than 90% of that of the first voltage pulse and equal to or less than 110% of that of the first voltage pulse), or may be equal to that of the first voltage pulse. In addition, the amplitude of the first recovery voltage pulse may be equal to or less than that of the first voltage pulse (equal to or less than 100% of that of the first voltage pulse), or smaller than that of the first voltage pulse. The above applies to an additional recovery process as will be described later.

The pulse width of the first recovery voltage pulse may be about as great as that of the first voltage pulse (equal to or greater than 80% of that of the first voltage pulse and equal to or less than 120% of that of the first voltage pulse), may be substantially equal to that of the first voltage pulse (equal to or greater than 90% of that of the first voltage pulse and equal to or less than 110% of that of the first voltage pulse), or may be equal to that of the first voltage pulse. In addition, the pulse width of the first recovery voltage pulse may be equal to or less than that of the first voltage pulse, or smaller than that of the first voltage pulse. The above applies to the additional recovery process as will be described later.

The pulse width of the second recovery voltage pulse may be about as great as that of the second voltage pulse (equal to or greater than 80% of that of the second voltage pulse and equal to or less than 120% of that of the second voltage pulse), may be substantially equal to that of the second voltage pulse (equal to or greater than 90% of that of the second voltage pulse and equal to or less than 110% of that of the second voltage pulse), or may be equal to that of the second voltage pulse. In addition, the pulse width of the second recovery voltage pulse may be equal to or more than that of the second voltage pulse, or greater than that of the second voltage pulse.

Hereinafter, "recovery of function of conductive path" which is an example of the recovery step will be described in detail.

Figure 2A:
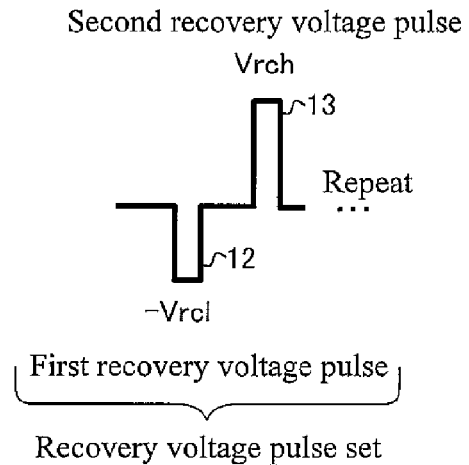
FIG. 2A is a schematic view of a pulse waveform in a case where a first recovery voltage pulse and a second recovery voltage pulse are applied alternately in repetition.
Figure 2B:
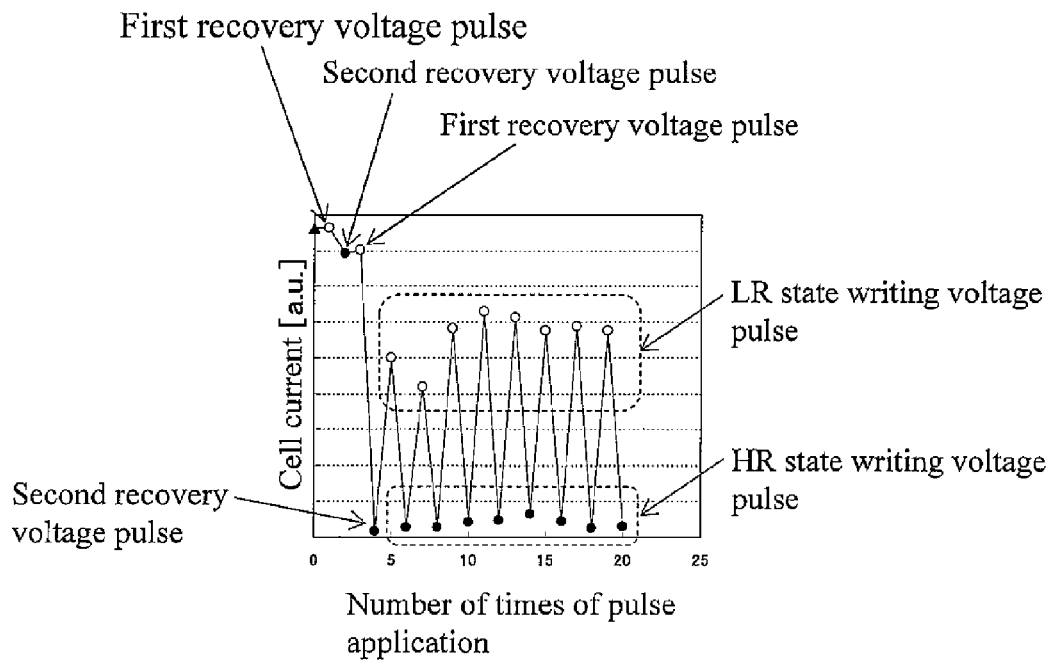
FIG. 2B is a view showing a recovery characteristic from the state of "LR frozen state" and a normal resistance changing characteristic resulting from the recovery from the state of "LR frozen state", in a case where the first recovery voltage pulse and the second recovery voltage pulse of FIG. 2A are applied alternately in repetition.

FIG. 2B shows an exemplary characteristic of the HR state writing recovery from the state of "LR frozen state", and an exemplary resistance changing characteristic after the HR state writing has been recovered, in a case where a first recovery voltage pulse 12 (voltage: −Vrcl, pulse width: 50 ns) and a second recovery voltage pulse 13 (voltage: Vrch, pulse width: 50 ns) of FIG. 2A are applied alternately plural times in repetition between the lower electrode terminal 101 and the upper electrode terminal 102 of the 1T1R memory cell including the variable resistance element of FIG. 17.

Vrch>VH is satisfied. Vrcl may be greater or smaller than VL or may be equal to VL so long as Vrcl is close to VL. In addition, Vrcl≤VL, or Vrcl<VL. VH indicates the voltage of the HR state writing voltage pulse, while VL indicates the voltage of the LR state writing voltage pulse. Although in this example, the pulse width of the second recovery voltage pulse 13 is set to 50 ns and the pulse width of the HR state writing voltage pulse 10 is also set to 50 ns, they may be different from each other. When the threshold of the NMOS transistor 104 is Vth, in a case where the first recovery voltage pulse 12 (voltage: −Vrcl) is applied between the lower electrode terminal 101 and the upper electrode terminal 102 of the memory cell, and the voltage Vrcl is applied to the gate terminal 103 of the NMOS transistor 104, the voltage applied between both ends of the variable resistance element 100 is −(Vrcl−Vth), and is smaller by the threshold voltage of the NMOS transistor 104. When the second recovery voltage pulse 13 (voltage: Vrch) is applied between the lower electrode terminal 101 and the upper electrode terminal 102 of the memory cell, almost all of the voltage Vrch is applied between the both ends of the variable resistance element 100.

In FIG. 2B, a vertical axis and a horizontal axis indicate the same as those of the vertical axis and the horizontal axis of FIG. 1B.

FIG. 2B shows an exemplary resistance changing characteristic in a case where the operation of applying the first recovery voltage pulse 12 (voltage: −Vrcl) with the predetermined pulse width (e.g., 50 ns) to the memory cell in the state of "LR frozen state" of FIG. 1C and the operation of applying the second recovery voltage pulse 13 (voltage: Vrch) with the predetermined pulse width (e.g., 50 ns) to this memory cell are repeated alternately, as shown in FIG. 2A, and an exemplary resistance changing characteristic in a case where the HR state writing voltage pulse 10 (voltage: VH) in the normal operation and the LR state writing voltage pulse 11 (voltage: −VL) in the normal operation are applied alternately (the same condition as that of FIG. 1A) after the memory cell has been recovered from the state of "LR frozen state". The voltage Vrch is greater than the normal HR state writing voltage VH. At this time, the voltage Vrch is applied to the gate terminal 103.

As shown in FIG. 2B, by repeating application of the recovery voltage pulse set plural times (e.g., twice) to the memory cell in the state of "LR frozen state", a cell current is decreased drastically, and the memory cell recovers from the state of "LR frozen state", after the second recovery voltage pulse 13 is applied to the memory cell. Thereafter, when the normal resistance state writing voltage pulses (the same condition as that of FIG. 1(a)) are applied alternately to the memory cell in such a manner that the HR state writing voltage pulse 10 (voltage: VH) in the normal operation is applied with the predetermined pulse width (e.g., 50 ns) to the memory cell and the LR state writing voltage pulse 11 (voltage: −VL) in the normal operation is applied with the predetermined pulse width (e.g., 50 ns) to the memory cell (VL>VH, the gate voltage VL is applied to the gate terminal 103 of the transistor), the state of "LR frozen state" is resolved, and the resistance change can take place stably.

Figure 3A:
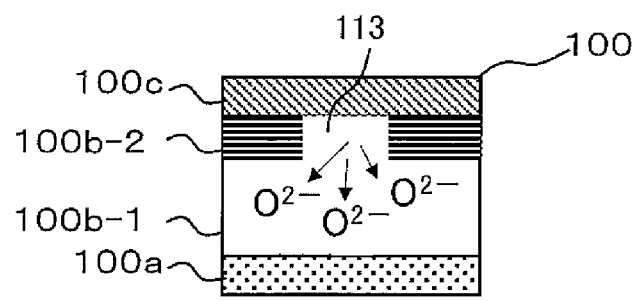
FIG. 3A is a conceptual view for explaining a process during the recovery from the state of "LR frozen state", which occurs by applying a recovery voltage pulse set.
Figure 3B:
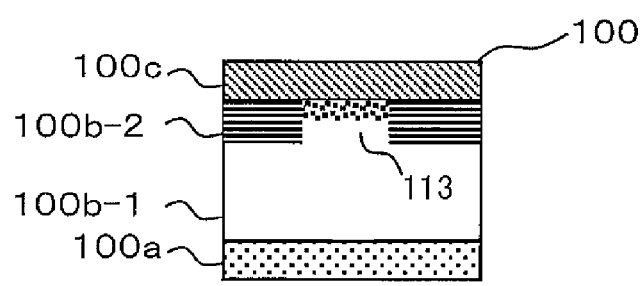
FIG. 3B is a conceptual view for explaining the process during the recovery from the state of "LR frozen state", which occurs by applying the recovery voltage pulse set.

FIGS. 3A and 3B are views for explaining the process during recovery from the state of the "LR frozen state", which occurs by applying the above described recovery voltage pulse set. In FIG. 3, the same constituents as those of FIG. 17 are identified by the same reference symbols and will not be described in repetition.

FIG. 3A shows the variable resistance element 100 in the state of "LR frozen state". As shown in FIG. 3A, in the state of "LR frozen state", the oxygen ions are released in excess from the filament 113 formed in the second metal oxide layer 100b-2 and oxygen vacancy density becomes high in excess, causing the variable resistance element 100 to be in the LR state to an excessive level, as compared to the normal LR state. It is considered that for the above stated reason, even when the normal HR state writing voltage pulse is applied, the voltage is not easily applied to the variable resistance element 100, and the filament (conductive path) does not change to the HR state and fails to function.

As shown in FIG. 3B, it is considered that in a case where the recovery voltage pulse set is applied in repetition to the variable resistance element 100 in the state of "LR frozen state", the excessive oxygen vacancy density in the filament 113 is reduced to a normal level and the filament 113 is recovered to the normal state.

As shown in FIG. 4, in a case where only the second recovery voltage pulse 13 (voltage: Vrch) of FIG. 2A is applied in repetition to the variable resistance element 100 in the state of "LR frozen state", the recovery of the resistance changing characteristic of FIG. 2B is not observed.

The summary of the above described operation and phenomenon will be described. By applying the recovery voltage pulse set to the memory cell in the state of "LR frozen state" in such a manner that the first recovery voltage pulse 12 (voltage: −Vrcl) is applied to the memory cell, and then the second recovery voltage pulse 13 (voltage: Vrch) is applied to the memory cell, the excessive oxygen vacancy present in the filament can be reduced to the normal level and the filament is allowed to function properly. As a result, the resistance changing characteristic can be stabilized, and the life which can withstand rewriting can be extended.

(2) (Increase in Pulse Width of Second Recovery Voltage Pulse in Recovery of Function of Conductive Path)

Next, a description will be given of an increase in the pulse width of the second recovery voltage pulse in the recovery of the function of the conductive path (additional recovery process) which is a modified example of the method of the recovery from the state of "LR frozen state".

In a case where it is determined that the resistance state of the variable resistance non-volatile memory element cannot switch to the first resistance state (e.g., HR) and remains (is stuck) in the second resistance state (e.g., LR), in the above described first determination step, the recovery voltage pulse set is applied to the variable resistance non-volatile memory element at least once, the recovery voltage pulse set being two pulses which are composed of (1) the first recovery voltage (e.g., negative voltage) pulse which has the same polarity as that of the first voltage (e.g., −VL), and (2) the second recovery voltage (e.g., positive voltage) pulse which has the same polarity as that of the second voltage (e.g., VH), has a greater amplitude than the second voltage (e.g., VH), has a longer pulse width than the second voltage pulse, and is applied subsequently to the first recovery voltage pulse.

Now, a description will be given of a HR state writing recovery method (example of "new recovery step") which is performed in a case where the memory cell cannot be recovered from the state of "LR frozen state", even after performing the above-described (1) the HR state writing recovery implemented by the recovery of the function of the conductive path (example of "recovery step").

Figure 5A:
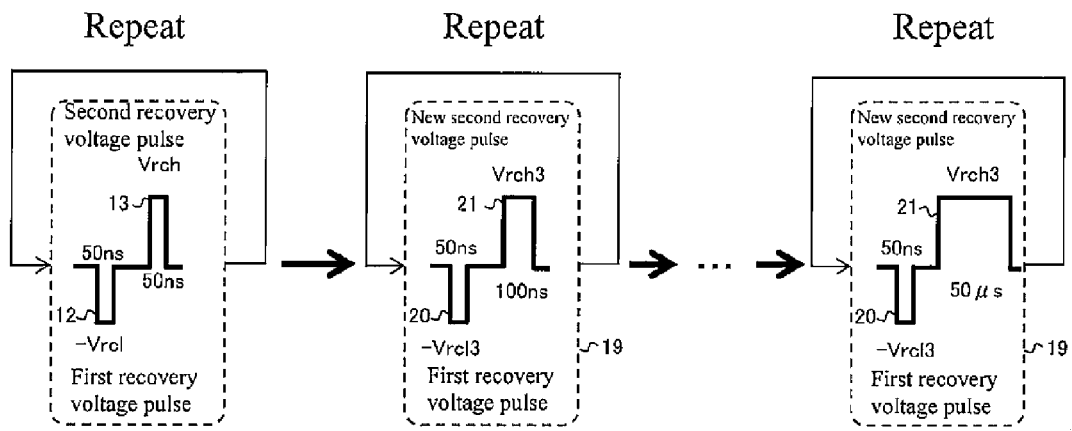
FIG. 5A is a schematic view of a pulse waveform in a case where the first recovery voltage pulse and a new second recovery voltage pulse are applied alternately in repetition.

As shown in FIG. 5A, the recovery voltage pulse set of FIG. 2A is applied in repletion (e.g., five times in repetition) to the 1T1R memory cell including the variable resistance element of FIG. 17. A voltage pulse set composed of a first recovery voltage pulse 20 (voltage: −Vrcl3, pulse width: TpL=50 ns) and a new second recovery voltage pulse 21 (voltage: Vrch3, Vrch3>VH, pulse width: TpH(m), m=1, 2, . . . ), will be referred to as "new recovery voltage pulse set". The new recovery voltage pulse set 19 is applied predetermined number of times (e.g., five times) in repetition while sequentially increasing the pulse width TpH(m) from TpH(1) to TpH(6).

Figure 5B:
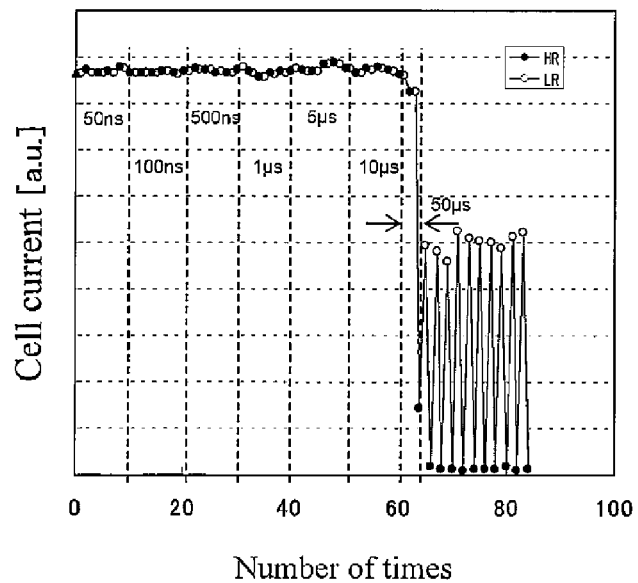
FIG. 5B is a view showing a recovery characteristic from the state of "LR frozen state", in a case where the first recovery voltage pulse and the second recovery voltage pulse of FIG. 5A are applied alternately in repetition.

FIG. 5B shows an exemplary characteristic of the HR state writing recovery from the state of the "LR frozen state" in the above case.

The amplitude (Vrcl3) of the first recovery voltage pulse 20 included in the new recovery voltage pulse set 19 may be equal to or different from the amplitude (Vrcl) of the first recovery voltage pulse 12. Or, the amplitude (Vrcl3) of the first recovery voltage pulse 20 included in the new recovery voltage pulse set 19 may be equal to or greater than the amplitude of the first recovery voltage pulse 12, or greater than the amplitude of the first recovery voltage pulse 12. The amplitude of the first recovery voltage pulse 20 included in the new recovery voltage pulse set 19 may be changed according to the value of "m".

The pulse width of the first recovery voltage pulse 20 included in the new recovery voltage pulse set 19 may be equal to or different from the pulse width of the first recovery voltage pulse 12. Or, the pulse width of the first recovery voltage pulse 20 included in the new recovery voltage pulse set 19 may be equal to or greater than the pulse width of the first recovery voltage pulse 12, or longer than the pulse width of the first recovery voltage pulse 12. The pulse width of the first recovery voltage pulse 20 included in the new recovery voltage pulse set 19 may be changed according to the value of "m".

The amplitude (Vrch3) of the second recovery voltage pulse 21 included in the new recovery voltage pulse set 19 may be equal to or different from the amplitude (Vrch) of the second recovery voltage pulse 13. Or, the amplitude (Vrch3) of the second recovery voltage pulse 21 included in the new recovery voltage pulse set 19 may be equal to or greater than the amplitude of the second recovery voltage pulse 13, or greater than the amplitude of the second recovery voltage pulse 13. The amplitude of the second recovery voltage pulse 21 included in the new recovery voltage pulse set 19 may be changed according to the value of "m".

For example, TpH (1)=100 ns, TpH (2)=500 ns, TpH(3)=1 μs, TpH(4)=5 μs, TpH(5)=10 μs, and TpH(6)=50 μs. In FIG. 5B, a vertical axis and a horizontal axis indicate the same as those of the vertical axis and the horizontal axis of FIG. 2B. Vrcl3 may be smaller or greater than VL so long as Vrcl3 is close to VL. VH indicates the amplitude of the HR state writing voltage pulse, and VL indicates the amplitude of the LR state writing voltage pulse.

As shown in FIG. 5B, when the pulse width TpH (in this example, 50 ns) of the second recovery voltage pulse 13 (voltage: Vrch) is about as great as that of the normal HR state writing voltage pulse 10 (voltage: VH), the memory cell cannot be recovered from the state of "LR frozen state" even after the first recovery voltage pulse 12 and the second recovery voltage pulse 13 are applied in repetition (in this example, five times). Thereafter, the new recovery voltage pulse set 19 composed of the first recovery voltage pulse 20 (voltage: −Vrcl3, pulse width: TpL=50 ns) and the new second recovery voltage pulse 21 (voltage: Vrch3, Vrch3>VH, pulse width: TpH(m), m=1, 2, . . . ), is applied in repetition (in this example, five times) while sequentially increasing the pulse width TpH(m) from TpH(1) to TpH(6). This results in a situation in which an oxidation capability is gradually improved, the excessive oxygen vacancy present in the filament are reduced to the normal level, and the filament is allowed to operate properly. As a result of this, the memory cell can be recovered from the state of "LR frozen state" by second application of the new recovery voltage pulse set 19 with the pulse width TpH(m) increased up to to TpH(6)(=50 μs). Therefore, even if the state of "LR frozen state" in a severe level, occurs, the oxidation capability is gradually improved, and the excessive oxygen vacancy present in the filament are easily reduced to the normal level, by sequentially increasing the pulse width TpH (m) (m=1, 2, 3, . . . ) of the new second recovery voltage pulse 21. It is estimated that because of this, the memory cell can be recovered more easily from the state of "LR frozen state".

The first recovery voltage pulse 20 included in the new recovery voltage pulse set 19 may be the same as the first recovery voltage pulse 12. The pulse width of the first recovery voltage pulse 20 included in the new recovery voltage pulse set 19 need not always be equal to that of the first recovery voltage pulse 12. In addition, the amplitude of the voltage (Vrch3) of the new second recovery voltage pulse 21 may be equal to or greater than the voltage (Vrch) of the second recovery voltage pulse 13.

Figure 6:
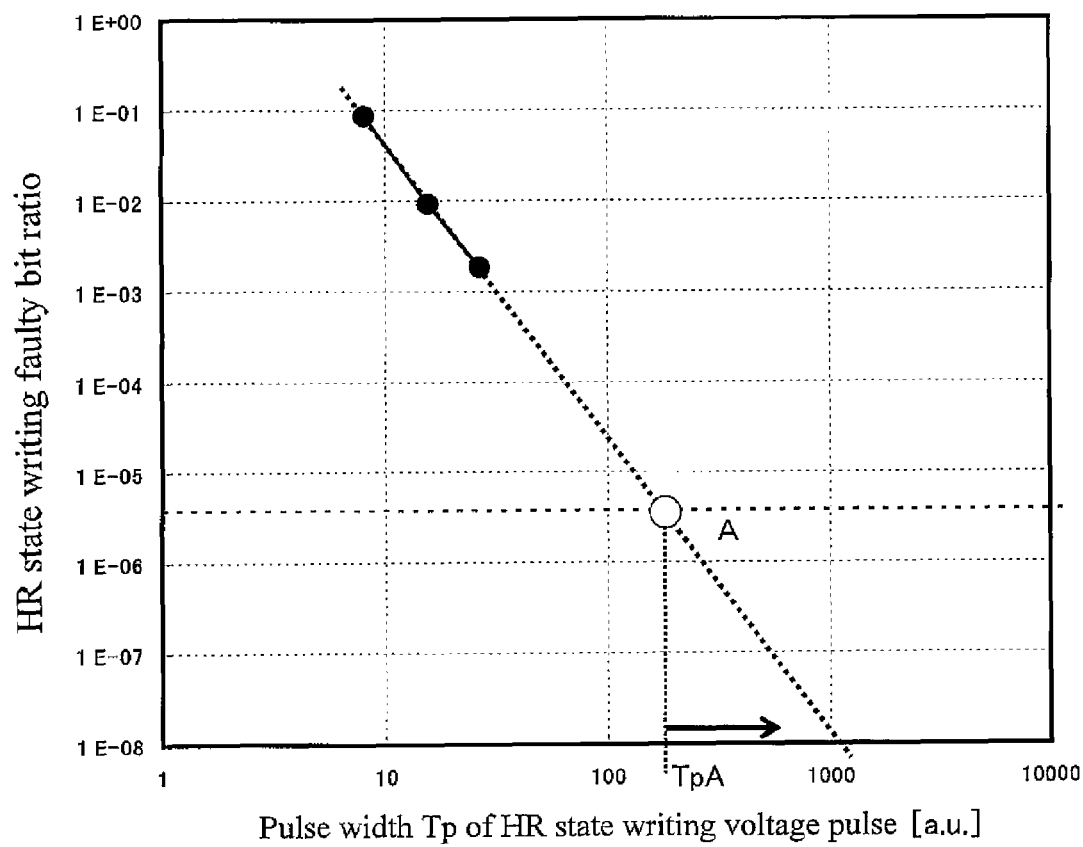
FIG. 6 is a view of a characteristic showing a dependency of a HR state writing failure bit ratio on a HR state writing pulse width.

FIG. 6 shows measurement of the relationship between a HR state writing pulse width Tp and a HR state writing failure bit ratio in a case where the HR state writing voltage pulse 10 (voltage: VH, pulse width: Tp) is applied once to the 1T1R memory cell of FIG. 17, in the LR state.

This measurement was conducted to estimate the pulse width Tp of the HR state writing voltage pulse required to stably change all bits in the array to the HR state. Specifically, the variable resistance non-volatile memory device incorporating an array in which the 1T1R memory cells of FIG. 17 were arranged in 256 kilobits was used. The HR state writing voltage pulse 10 having a predetermined pulse width Tp was applied only once to all bits of the 256 kilobit array which was preset in the LR state. The ratio of HR state writing faulty bits which could not be switched to the predetermined HR state was calculated. This measurement was repeated while changing the pulse width Tp of the HR state writing voltage pulse. Hereinafter, the ratio of the HR state writing faulty bits which could not be switched to the predetermined HR state after the HR state writing voltage pulse 10 was applied only once to all bits in the array, will be referred to as the HR state writing failure bit ratio. In FIG. 6, a vertical axis indicates the HR state writing failure bit ratio, while a horizontal axis indicates the pulse width Tp [a.u.] of the corresponding HR state writing voltage pulse. Since the configuration and specific operation method of the variable resistance non-volatile memory device used in this measurement will be described later in a part relating to the variable resistance non-volatile memory device, and will not be described in repetition.

As can be seen from FIG. 6, when the pulse width Tp of the HR state writing voltage pulse is increased, the HR state writing failure bit ratio can be exponentially reduced significantly. It is estimated that the HR state writing voltage pulse is required to have the pulse width Tp which is longer than TpA to allow the bit which is less than 1 bit among 256 kilobits to become a faulty bit, as shown in a point A, i.e., to substantially change all of 256 kilobits to the HR state by applying the HR state writing voltage pulse 10 once (this is because the HR state writing failure bit ratio corresponding to the point A corresponds to 1/256 k). As should be understood, the HR state writing voltage pulse 10 having a long pulse width is effectively applied to stably change all bits in the array to the HR state. It is estimated that the new recovery voltage pulse set 19 obtained by increasing the pulse width TpH (m) (m=1, 2, . . . ) of the second recovery voltage pulse 21 is applied effectively to address the above mentioned state of "LR frozen state" in a severe level, which occurs unexpectedly.

[Configuration of Variable Resistance Non-Volatile Memory Device of Embodiment 1]

Based on the above described finding obtained from the basic data relating to the recovery from the state of "LR frozen state" to the HR state writing, the inventors conceived a non-volatile memory device which performs a suitable HR state writing recovery operation for a faulty cell in the state of "LR frozen state". Hereinafter, the 1T1R non-volatile memory device incorporating the variable resistance element of FIG. 17 will be described as Embodiment 1.

Figure 7:
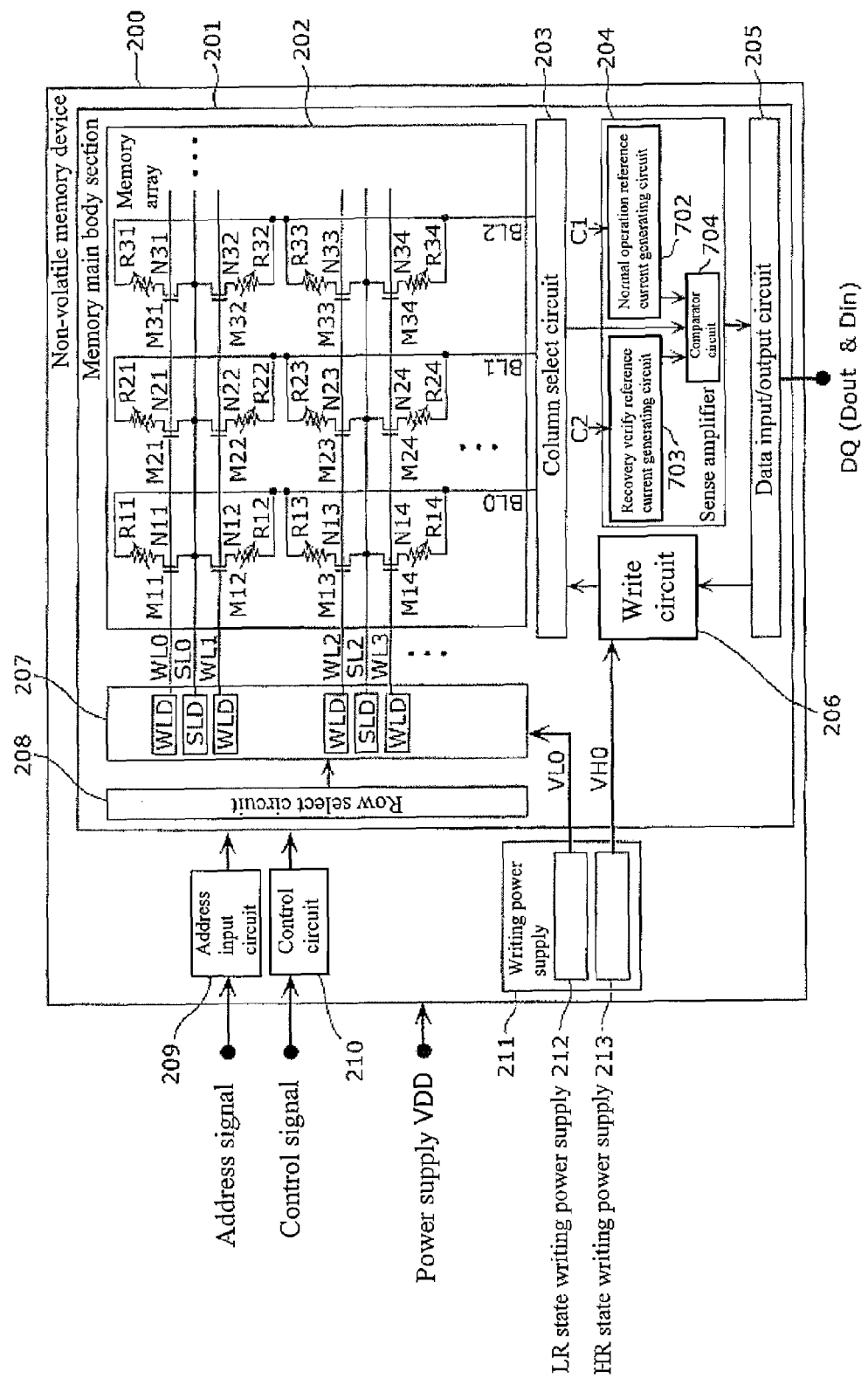
FIG. 7 is a block diagram showing an exemplary schematic configuration of a variable resistance non-volatile memory device according to Embodiment 1.

FIG. 7 is a block diagram showing an exemplary schematic configuration of the variable resistance non-volatile memory device according to Embodiment 1.

In the example of FIG. 7, a non-volatile memory device 200 of Embodiment 1 includes memory cells M11 each of which includes the variable resistance non-volatile memory element and the switching element which are connected in series, etc., and a driving circuit (peripheral circuit) for driving the memory cells.

The variable resistance non-volatile memory element (e.g., variable resistance element 100) includes the first electrode (e.g., lower electrode 100a), the second electrode (e.g., upper electrode 100c), and the variable resistance layer (e.g., variable resistance layer 100b) sandwiched between the first electrode and the second electrode, and the variable resistance layer includes the first metal oxide layer (e.g., first metal oxide layer 100b-1) which is in contact with the first electrode, and the second metal oxide layer (e.g., second metal oxide layer 100b-2) which is in contact with the second electrode and is lower in degree of oxygen deficiency than the first metal oxide layer. It is supposed that the variable resistance non-volatile memory element has a characteristic in which it changes the resistance state from the first resistance state (e.g., HR) used to store first information (e.g., "0") to the second resistance state (e.g., LR) used to store second information (e.g., "1"), by application of the first voltage (e.g., −VL) pulse (e.g., LR state writing voltage pulse 11), and it changes the resistance state from the second resistance state (e.g., LR) to the first resistance state (e.g., HR), by application of the second voltage (e.g., VH) pulse (HR state writing voltage pulse 10) which is different in polarity from the first voltage.

The driving circuit includes a write circuit 206 for writing the information to the memory cell, a sense amplifier 204 for reading the information from the memory cell, and a control circuit 210 for performing the first determination step of determining, using the sense amplifier 204, whether or not the resistance state of variable resistance non-volatile memory element state cannot switch to the first resistance state (e.g., HR) and remains (is stuck) in the second resistance state (e.g., LR) (e.g., "LR frozen state" occurs), when the second voltage (e.g., VH) pulse is applied to the variable resistance non-volatile memory element, by the write circuit 206.

The control circuit 210 controls the write circuit 206 so that when the control circuit 210 determines that the resistance state of the variable resistance non-volatile memory element cannot switch to the first resistance state (e.g., HR) and remains (is stuck) in the second resistance state (e.g., LR) in the first determination step, it performs the recovery step of applying the recovery voltage pulse set to the variable resistance non-volatile memory element at least once, the recovery voltage pulse set being composed of two pulses which are (1) the first recovery voltage (e.g., negative voltage) pulse 12 which has the same polarity as that of the first voltage, and a second recovery voltage (e.g., positive voltage) pulse 13 which has the same polarity as that of the second voltage (VH), has a greater amplitude than the second voltage, and is applied subsequently to the first recovery voltage pulse 12.

The control circuit 210 may further perform using the sense amplifier 204, a second determination step of determining whether or not the resistance state of the variable resistance non-volatile memory element has switched to the first resistance state (e.g., HR) by application of the recovery voltage pulse set, and may repeat application of the recovery voltage pulse set in the recovery step and determination in the second determination step until the resistance state of the variable resistance non-volatile memory element has switched to the first resistance state (e.g., HR). In this case, the second recovery voltage pulse 13 may have a longer pulse width than the second voltage pulse (e.g., HR state writing voltage pulse 10).

When the resistance state of the variable resistance non-volatile memory element does not switch to the first resistance state (e.g., HR), even after control circuit 210 has repeated application of the recovery voltage pulse set in the recovery step and determination in the second determination step, predetermined number of times, the control circuit 210 may convert the second recovery voltage pulse 13 into the new second recovery voltage pulse 21 having a longer pulse width than the second recovery voltage pulse 13, and then apply the new recovery voltage pulse set 19 to the variable resistance non-volatile memory element at least once in the recovery step.

When the resistance state of the variable resistance non-volatile memory element does not switch to the first resistance state (e.g., HR), even after the control circuit 210 has repeated application of the recovery voltage pulse set in the recovery step and determination in the second determination step, predetermined number of times, the control circuit 210 may convert the second recovery voltage pulse into the new second recovery voltage pulse 21 having a longer pulse width than the second recovery voltage pulse, and then may repeat predetermined number of times application of the new recovery voltage pulse set 19 in the recovery step and determination in the second determination step.

The new second recovery voltage pulse 21 may have a greater amplitude than the second recovery voltage pulse 13 before conversion.

Hereinafter, the non-volatile memory device 200 configured as described above will be described in detail.

As shown in FIG. 7, the non-volatile memory device 200 of Embodiment 1 includes a memory main body section 201 on a semiconductor substrate. The memory main body section 201 includes a memory cell array 202 including the 1T1R memory cells each of which is shown in FIG. 17, a row driver 207 including a row select circuit 208, word line driver circuits WLD and source line driver circuits SLD, a column select circuit 203, the write circuit 206 for writing data, the sense amplifier 204 for detecting an amount of a current flowing through a selected bit line and determining the high-resistance state as data "0" or the low-resistance state as data "1", and a data input/output circuit 205 for performing input/output processing of input/output data via a terminal DQ.

The non-volatile memory device 200 further includes as a writing power supply 211, a high-resistance (HR) state writing power supply 213 and a low-resistance (LR) state writing power supply 212.

The non-volatile memory device 200 further includes an address input circuit 209 which receives an address signal externally input, and the control circuit 210 for controlling the operation of the memory main body section 201 in accordance with a control signal externally input thereto.

The memory cell array 202 includes a plurality of word lines WL0, WL1, WL2, WL3, . . . and a plurality of bit lines BL0, BL1, BL2, . . . , which are formed above the semiconductor substrate such that the plurality word lines cross the plurality of bit lines, respectively, a plurality of NMOS transistors N11, N12, N13, N14, . . . , N21, N22, N23, N24, . . . , N31, N32, N33, N34, . . . (hereinafter will be expressed as "transistors N11, N12, . . . ") provided as switching elements such that they respectively correspond to cross-points of the plurality of word lines WL0, WL1, WL2, WL3, . . . and the plurality of bit lines BL0, BL1, BL2, . . . , respectively, and a plurality of variable resistance elements R11, R12, R13, R14, . . . , R21, R22, R23, R24, . . . , R31, R32, R33, R34, . . . (hereinafter, will be expressed as variable resistance elements R11, R12, . . . "), which are connected in series with the transistors N11, N12, . . . such that one variable resistance element corresponds to one transistor. Sets each of which is composed of one of the transistors N11, N12, . . . and the corresponding one of the variable resistance elements R11, R12, . . . constitute the memory cells M11, M12, M13, M14, . . . M21, M22, M23, M24, . . . , M31, M32, M33, M34, . . . (hereinafter will be expressed as "memory cells M11, M12, . . . "), respectively.

As shown in FIG. 7, the gates of the transistors N11, N21, N31, . . . , are connected to the word line WL0, the gates of the transistors N12, N22, N32, . . . , are connected to the word line WL1, the gates of the transistors N13, N23, N33, . . . , are connected to the word line WL2, and the gates of the transistors N14, N24, N34, . . . , are connected to the word line WL3.

The transistors N11, N21, N31, . . . and the transistors N12, N22, N32, . . . are connected to a common source line SL0, while the transistors N13, N23, N33, . . . and the transistors N14, N24, N34, . . . are connected to a common source line SL2. In other words, the source lines SL0, SL2, . . . are placed such that they extend in parallel with the word lines WL0, WL1, WL2, WL3, . . . , and three-dimensionally cross the bit lines BL0, BL1, BL2, . . . (in the present embodiment, the source lines SL0, SL2, . . . are perpendicular to the bit lines BL0, BL1, BL2, . . . ).

Although in the above described exemplary configuration, the source lines are placed in parallel with the word lines, they may be placed in parallel with the bit lines. Although the source lines are configured to apply an equal electric potential to the transistors, the non-volatile memory device may include a source line select circuit/driver having a configuration similar to that of the row select circuit/driver, and the source line select circuit/driver may be configured to drive a selected source line and an unselected source line, with different voltages (including different polarities).

The variable resistance elements R11, R12, R13, R14, . . . are connected to the bit line BL0, the variable resistance elements R21, R22, R23, R24, . . . are connected to the bit line BL1, and the variable resistance elements R31, R32, R33, R34, . . . are connected to the bit line BL2. In this way, in the memory cell array 202 of the present embodiment, the variable resistance elements R11, R21, R31, . . . are directly connected to the corresponding bit lines BL0, BL1, BL2, . . . such that the NMOS transistors N11, N21, N31, . . . are not interposed between the variable resistance elements R11, R21, R31 . . . and the bit lines BL0, BL1, BL2, . . . .

During a HR state writing recovery operation, the control circuit 210 outputs to the write circuit 206 a HR state writing recovery signal for causing application of a predetermined recovery voltage. During a write cycle of data, the control circuit 210 outputs to the write circuit 206, a write signal for causing application of a write voltage, according to input data Din input to the data input/output circuit 205. During a read cycle of data, the control circuit 210 outputs to the sense amplifier 204 a read signal for causing a reading operation.

The row select circuit 208 receives the row address signal output from the address input circuit 209, and applies a predetermined voltage to the selected word line, from the row driver 207 (from the word line driver circuit WLD corresponding to the word line selected from among the plurality of word lines WL0, WL1, WL2, WL3, . . . ), based on the received row address signal.

In the same manner, the row select circuit 208 receives the row address signal output from the address input circuit 209, and applies a predetermined voltage to the selected source line, from the row driver 207 (from the source line driver circuit SLD corresponding to the source line selected from among the plurality of source lines SL0, SL2, . . . ), based on the received row address signal.

When the write circuit 206 receives a HR state writing recovery signal output from the control circuit 210, it applies to the bit line selected by the column select circuit 203, the voltage pulse (e.g., first recovery voltage pulse 12 and second recovery voltage pulse 13) for the HR state writing recovery operation, having the predetermined pulse width and the predetermined amplitude. When the write circuit 206 receives a write signal output from the control circuit 210, it applies to the bit line selected by the column select circuit 203, the writing voltage pulse in the normal operation (e.g., one of the HR state writing voltage pulse 10 and the RL state writing voltage pulse 11).

The writing power supply 211 includes the LR state writing power supply 212 for writing the LR state and the HR state writing power supply 213 for writing the HR state. An output voltage VL0 of the LR state writing power supply 212 is input to the row driver 207, while an output voltage VH0 of the HR state writing power supply 213 is input to the write circuit 206.

Figure 8:
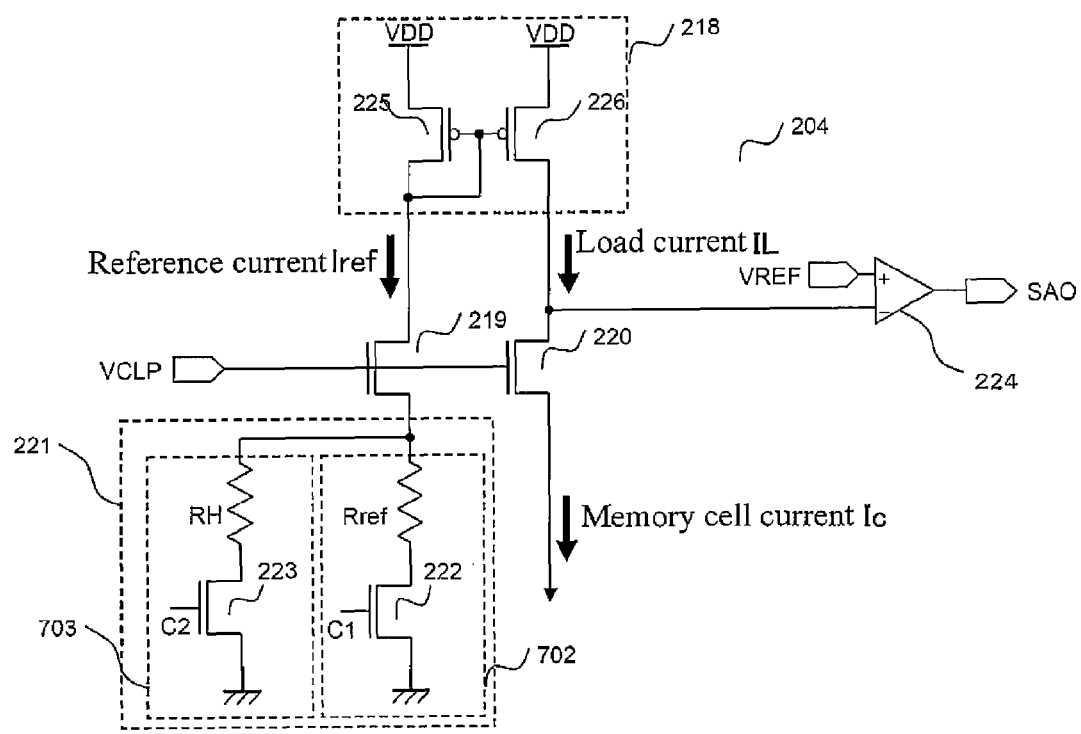
FIG. 8 is a circuit diagram showing an exemplary detailed configuration of a sense amplifier according to Embodiment 1.

FIG. 8 is a circuit diagram showing an exemplary detailed configuration of the sense amplifier 204 of FIG. 7.

For example, the sense amplifier 204 includes clamp transistors 219, 220 which are equal in size to a current mirror circuit 218 in which a mirror ratio is 1:1, a reference circuit 221, and a differential amplifier 224. The reference circuit 221 includes a normal operation reference current generating circuit 702 and a HR state writing verify reference current generating circuit 703.

The normal operation reference current generating circuit 702 is configured such that one end of a branch including a select transistor 222 and a normal reading reference resistor (resistance) Rref which are connected in series is connected to a ground potential, while the other end thereof is connected to the source terminal of the clamp transistor 219. A read enable signal C1 is input to the gate terminal of the select transistor 222, to switch the select transistor 222 between the conductive state and the non-conductive state.

The HR state writing verify reference current generating circuit 703 is configured such that one end of a branch including a select transistor 223 and a HR state writing verify reference resistor (resistance) RH (RH>Rref) which are connected in series is connected to a ground potential, while the other end thereof is connected to the source terminal of the clamp transistor 219. A HR state writing verify enable signal C2 is input to the gate terminal of the select transistor 223, to switch the select transistor 223 between the conductive state and the non-conductive state.

A clamp voltage VCLP (VCLP<VDD) is input to the gate terminals of the clamp transistors 219, 220. The source terminal of the clamp transistor 220 is connected to the memory cell via the column select circuit 203 and the bit line. The drain terminal of the clamp transistor 219 and the drain terminal of the clamp transistor 220 are connected to the drain terminal of the transistor 225 and the drain terminal of the transistor 226, respectively (the transistors 225, 226 constitute the current mirror circuit 218). The electric potential at the drain terminal of the clamp transistor 220 is compared to a reference electric potential VREF by the differential amplifier 224. Then, the electric potential at the drain terminal of the clamp transistor 220 is inverted and amplified. Then, the electric potential inverted and amplified is transmitted to the data input/output circuit 205 as output SAO of the sense amplifier.

Figure 9:
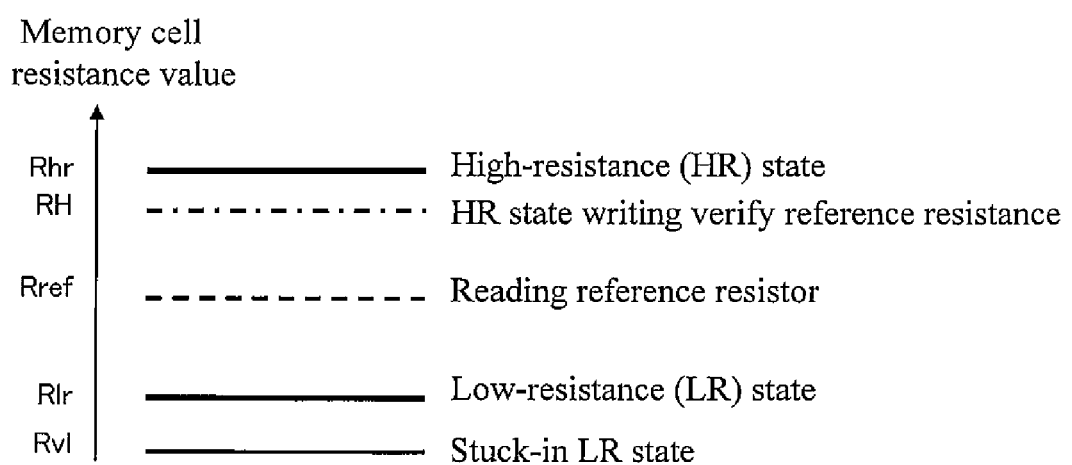
FIG. 9 is a view showing determination levels in the sense amplifier according to Embodiment 1.

FIG. 9 is a view for explaining determination levels in the sense amplifier 204 configured as described above. As shown in FIG. 9, the sense amplifier 209 has two determination levels which are the normal reading reference resistance Rref (Rlr<Rref<Rhr) and the HR state writing verify reference resistance RH (Rref<RH<Rhr) which is greater than the normal reading reference resistance Rref, between the resistance value (=Rhr) of the memory cell in the (HR) state and the resistance value (=Rlr) of the memory cell in the (LR) state.

The HR state writing verify reference resistance RH is set to a resistance value which is smaller than the resistance value corresponding to the HR state, to determine whether or not the HR state writing to the variable resistance element has completed. For example, the HR state writing verify reference resistance RH is set to a resistance value which is smaller than the resistance value corresponding to the HR state and close to the resistance value corresponding to the HR state. The normal reading reference resistance Rref is set to a resistance value which is smaller than the resistance value corresponding to the HR state and greater than the resistance value corresponding to the LR state, to determine whether the variable resistance element is in the HR state or the LR state.

The resistance value of the memory cell in the state of "LR frozen state" is expressed as Rvl (Rvl<Rlr).

[Operation of Variable Resistance Non-Volatile Memory Device of Embodiment 1 and Writing Method of Variable Resistance Non-Volatile Memory Element of Embodiment 1]

Regarding the variable resistance non-volatile memory device configured as described above, the operation of the primary circuit block is firstly described and then the normal operation of the variable resistance non-volatile memory device, the HR state writing recovery operation resulting from the recovery of the function of the conductive path, and the pulse width increase operation of the second recovery voltage pulse in the recovery of the function of the conductive path, will be described.

Firstly, the operation of the sense amplifier 204 shown in FIG. 8 will be described. In the step of writing the HR state to the variable resistance element, the HR state writing positive voltage pulse is applied to the variable resistance element, and then the sense amplifier 204 is connected to a target memory cell via the column select circuit 203 and the bit line. A voltage which is greater than the voltage (VCLP−Vth) which is smaller than the clamp voltage VCLP by the threshold voltage (Vth) of the clamp transistors 219, 220, is not applied to the memory cell.

In the reference circuit 221, the select transistor 223 is activated by the HR state writing verify enable signal C2, and is placed in a conductive state, in which the HR state writing verify reference resistance RH is selected. The select transistor 222 is deactivated by the read enable signal C1 and placed in a non-conductive state. As a result, as the output of the reference circuit 221, a reference current Iref (=(VCLP−Vth)/RH) flows.

Therefore, the reference current Iref is transferred by the current mirror circuit 218. A load current IL which is almost equal to Iref flows (IL=Iref). The clamp transistor 220 makes a comparison for a magnitude relationship between the load current IL and the memory cell current Ic. According to a result of the comparison, the differential amplifier 224 detects whether the drain terminal voltage of the clamp transistor 220 is smaller or greater than the reference voltage VREF, and outputs the sense amplifier output SAO.

When the resistance value of the variable resistance element after application of the HR state writing voltage pulse (voltage: VH) is Rvl (resistance value in the state of "LR frozen state", Rvl<Rlr<RH<Rhr), the memory cell current Ic (=(VCLP−Vth)/Rvl) flows. At this time, the load current IL<memory cell current Ic. The drain terminal voltage of the clamp transistor 220 becomes smaller than the reference voltage VREF which is input to the differential amplifier 224 after a passage of predetermined time. The sense amplifier output SAO becomes H level. In other words, when the selected memory cell is in the state of "LR frozen state" (Rvl) in which its resistance state is lower than the HR state writing verify reference resistance RH, the sense amplifier 204 determines that the resistance state is "1", i.e., "fail".

In contrast, when the resistance value of the selected memory cell after application of the HR state writing voltage pulse (voltage: VH) becomes greater than Rhr (>RH) and the HR state writing verify reference resistance RH, because of the recovery of the function of the conductive path, the memory cell current Ic (=(VCLP−Vth)/Rhr) flows. At this time, the load current IL>memory cell current Ic. The drain terminal voltage of the clamp transistor 220 becomes greater than the reference voltage VREF which is input to the differential amplifier 224 after a passage of predetermined time. The sense amplifier output SAO becomes L level. In other words, when the selected memory cell is in the resistance state (Rhr) which is higher than the HR state writing verify reference resistance RH, the sense amplifier 204 determines that the resistance state is "0", i.e., "pass," indicating that the HR state writing to the target memory cell is completed.

During normal reading, in the reference circuit 221, the select transistor 222 is activated by the read enable signal C1 and is placed in a conductive state, in which the normal reading reference resistance Rref is selected. The select transistor 223 is deactivated by the HR state writing verify enable signal C2 and is placed in a non-conductive state. As a result, as the output of the reference circuit 221, a reference current Iref (=(VCLP−Vth)/Rref) flows.

Therefore, the reference current Iref is transferred by the current mirror circuit 218. The load current IL which is almost equal to Iref flows (IL=Iref). The clamp transistor 220 makes a comparison for a magnitude relationship between the load current IL and the memory cell current Ic. According to a result of the comparison, the differential amplifier 224 detects whether the drain terminal voltage of the clamp transistor 220 is smaller or greater than the reference voltage VREF, and outputs the sense amplifier output SAO.

When the selected memory cell is in the HR state in a case where the resistance value of the memory cell in the HR state is Rhr and the resistance value of the memory cell in the LR state is Rlr (Rhr>Rref>Rlr), the memory cell current Ic (=(VCLP−Vth)/Rhr) flows. At this time, the load current IL>memory cell current Ic. The drain terminal voltage of the clamp transistor 220 becomes greater than the reference voltage VREF which is input to the differential amplifier 224. The sense amplifier output SAO becomes L level. In other words, when the selected memory cell is in the HR state (Rhr) in which its resistance state is higher than the normal reading reference resistance Rref, the sense amplifier 204 determines that the data is "0".

On the other hand, when the selected memory cell is in the LR state, in the case where the resistance value of the memory cell in the HR state is Rhr and the resistance value of the memory cell in the LR state is Rlr, the memory cell current Ic (=(VCLP−Vth)/Rlr) flows. At this time, the load current IL<memory cell current Ic. The drain terminal voltage of the clamp transistor 220 becomes smaller than the reference voltage VREF which is input to the differential amplifier 224. The sense amplifier output SAO becomes H level. In other words, when the selected memory cell is in the LR state (Rlr) in which its resistance state is lower than normal reading reference resistance Rref, the sense amplifier 204 determines that the data is "1".

Next, with reference to FIG. 10, a description will be given of the voltage pulses applied to the memory cell, and the voltages applied to the word line (WL), the voltages applied to the source line (SL) and the voltages applied to the bit line (BL) to apply the voltage pulses to the memory cell, in a case where respective operations are performed, which are the HR state writing, the LR state writing and the normal reading in the normal operation, application of the first recovery voltage pulse, application of the second recovery voltage pulse, and the HR state writing verify reading in the HR state writing recovery operation performed by application of the first recovery voltage pulse set, and application of the first recovery voltage pulse, application of the new second recovery voltage pulse, and the HR state writing verify reading in the HR state writing recovery operation performed by application of the second recovery voltage pulse set. As described below, the voltages applied to the word line (WL), the voltages applied to the source line (SL) and the voltages applied to the bit line (BL) are generated in the LR state writing power supply 212 and the HR state writing power supply 213.

In the example of FIG. 10, the voltage VL for the LR state writing voltage pulse in the normal operation is generated in the HR state writing power supply 213 and supplied to the write circuit 206. Also, the voltage VL for the LR state writing voltage pulse in the normal operation is generated in the LR state writing power supply 212. The voltage VL is applied to the word line by the word line driver circuit WLD and applied to the source line by the source line driver circuit SLD.

The voltage VH for the HR state writing voltage pulse in the normal operation is generated in the HR state writing power supply 213 and supplied to the write circuit 206. Also, the voltage VL for the HR state writing voltage pulse in the normal operation is generated in the LR state writing power supply 212. The voltage VL is applied to the word line by the word line driver circuit WLD.

In the HR state writing recovery operation performed by applying the first recovery voltage pulse set, the voltage of the bit line BL during application of the first recovery voltage pulse represents a voltage pulse of a voltage −Vrcl, while the voltage of the bit line BL during application of the second recovery voltage pulse represents a voltage pulse of a voltage Vrch. During application of the first recovery voltage pulse, the voltage Vrcl is generated in the LR state writing power supply 212, and is applied to the word line by the word line driver circuit WLD and to the source line by the source line driver circuit SLD. The voltage Vrcl is generated in the HR state writing power supply 213 and applied to the bit line via the write circuit 206. It should be noted that during application of the second recovery voltage pulse, the voltage Vrch of the word line WL and the voltage Vrch of the bit line BL need not always be equal to each other.

In the HR state writing recovery operation performed by applying the second recovery voltage pulse set, the voltage of the bit line BL during application of the first recovery voltage pulse represents a voltage pulse of a voltage −Vrcl3, while the voltage of the bit line BL during application of the second recovery voltage pulse represents a voltage pulse of a voltage Vrch3. During application of the first recovery voltage pulse, the voltage Vrcl3 is generated in the LR state writing power supply 212, and is applied to the word line by the word line driver circuit WLD and to the source line by the source line driver circuit SLD. The voltage Vrcl3 is generated in the HR state writing power supply 213 and applied to the bit line via the write circuit 206. It should be noted that during application of the second recovery voltage pulse, the voltage Vrch 3 of the word line WL and the voltage Vrch3 of the bit line BL need not always be equal to each other.

In the normal reading and the HR state writing verify reading, the voltage Vread is a read voltage clamped by the sense amplifier 204. The voltage Vread corresponds to a voltage value adjusted so that a reading disturb does not occur (i.e., the resistance state of the variable resistance element does not change). VDD corresponds a power supply voltage supplied to the non-volatile memory device 200.

Hereinafter, a description will be given of examples of the data write cycle, the read cycle and the HR state writing recovery operation of the variable resistance non-volatile memory device 200 configured as described above, with reference to FIGS. 11A to 11C and FIG. 7.

FIGS. 11A to 11C are timing charts showing the exemplary operation of the non-volatile memory device 200 of Embodiment 1. In this example, the exemplary operation will be described assuming that a case where the variable resistance layer is in the high-resistance state corresponds to data "0" and a case where the variable resistance layer is in the low-resistance state corresponds to data "1". Hereinafter, a description will be given of a case where data is written to and read from one memory cell (e.g., memory cell M11).

FIG. 11A shows the timing chart of a cycle of the LR state writing (writing of data "1") to the memory cell M11 in the normal operation. In this cycle, the LR state writing voltage pulse (voltage: −VL) is applied to the memory cell M11.

In this cycle, initially, the selected bit line BL0 is set to voltage 0V and the selected source line SL0 is set to voltage 0V. Then, the selected bit line BL0 is set to voltage VL and the selected source line SL0 is set to voltage VL. Then, the word line WL0 to be selected is set to voltage VL. At this time, the NMOS transistor N11 of the selected memory cell M11 of FIG. 7 is still in OFF-state. In this stage, the voltage VL is applied to the drain terminal and source terminal of the NMOS transistor N11 of FIG. 7. Therefore, no current flows irrespective of ON/OFF of the transistor.

Then, for time t1, the selected bit line BL0 is set to voltage 0V. Then, a pulse waveform with voltage VL is applied again to the selected bit line BL0. In this stage, the LR state writing voltage pulse (voltage: −VL) is applied to the memory cell M11 of FIG. 7, and the resistance value of the memory cell M11 switches from the value corresponding to the high-resistance state to the value corresponding to the low-resistance state. After that, the word line WL0 is set to voltage 0V, and application of the LR state writing voltage pulse in the writing operation of the data "1" is completed. However, the LR state writing cycle is not limited to this operation.

As in the above described method, in the HR state writing recovery operation, the first recovery voltage pulse which is the negative voltage pulse is applied. In this case, the negative voltage Vrcl or the negative voltage Vrcl3 for recovering the function of the conductive path is applied to the memory cell M11 of FIG. 7. After that, the word line WL0 is set to voltage 0V, and application of the first recovery voltage pulse in the HR state writing recovery operation is completed.

In summary, the memory cells in a row direction are selected using the source line and the word line, and thereafter, the pulse waveform in the negative voltage direction is applied to the particular bit line, thereby allowing the negative voltage pulse to be applied to the variable resistance element of the memory cell selected by the source line, the word line and the bit line. In this way, the LR state writing is implemented.

FIG. 11B shows the timing chart of a cycle of the HR state writing (writing of data "0") to the memory cell M11 in the normal operation. In this cycle, the HR state writing voltage pulse (voltage: VH) is applied to the memory cell M11.

In this cycle, initially, the selected bit line BL0 is set to voltage 0V and the selected source line SL0 is set to 0V. Then, the word line WL0 to be selected is set to voltage VL, and the NMOS transistor N11 of the selected memory cell M11 of FIG. 7 is turned ON.

Then, for time th, the selected bit line BL0 is set to voltage VH. Then, a pulse waveform with a voltage 0V is applied again to the selected bit line BL0. In this stage, the positive voltage pulse VH is applied to the memory cell M11 of FIG. 7 to perform writing in such a manner that the resistance value of the memory cell M11 switches from the value corresponding to the low-resistance state to the value corresponding to the high-resistance state.

In the HR state writing recovery operation, by performing the above described method except for that used voltages are different, the second recovery voltage pulse which is the positive voltage pulse or the new second recovery voltage pulse is applied. In this case, the positive voltage Vrch or the positive voltage Vrch3 for recovering the function of the conductive path is applied to the memory cell M11 of FIG. 7, the filament changes to the high-resistance state because of the recovery of the function of the conductive path, and the memory cell M11 in the state of "LR frozen state" increases its resistance value and switches to the normal state (state in which the resistance change can occur by application of the driving voltage pulse in the normal operation).

After that, the word line WL0 is set to voltage 0V, and writing of data "0" in the normal operation, application of the second recovery voltage pulse or the new second recovery voltage pulse in the HR state writing recovery operation is completed.

In summary, the memory cell in a row direction is selected using the source line and the word line, and thereafter, the pulse waveform in the positive voltage direction is applied to the particular bit line, thereby allowing the positive voltage pulse to be applied to the variable resistance element of the memory cell selected by the source line, the word line and the bit line. However, this method is merely exemplary.

In the HR state writing recovery operation, as described above, the first recovery voltage pulse is applied according to the application method of the negative voltage pulse of FIG. 11A, and subsequently, the second recovery voltage pulse or the new second recovery voltage pulse is applied according to the application method of the positive voltage pulse of FIG. 11B. Further, the pair of the negative voltage pulse and the positive voltage pulse are applied plural times in repetition. By this operation, the memory cell in the state of "LR frozen state" switches to the state in which the resistance change can occur.

FIG. 11C shows the timing chart of a cycle of reading of data from the memory cell M11. In this reading cycle, initially, the selected bit line BL0 is set to voltage 0V and the selected source line SL0 is set to voltage 0V. Then, the word line WL0 to be selected is set to voltage VDD (VDD>Vread), and the NMOS transistor N11 of the selected memory cell M11 is turned ON.

Then, for time tr, the selected bit line BL0 is set to the read voltage Vread. The sense amplifier 204 detects a value of a current flowing through the selected memory cell M11, to determine whether the stored data is the data "0" or the data "1". After that, the word line WL0 is set to voltage 0V, and the data reading operation is completed.

Regarding the reading operation, the sense amplifier 204 uses the normal reading reference resistance Rref in the normal operation and uses the HR state writing verify reference resistance RH in the normal HR state writing operation and in the HR state writing recovery operation (FIG. 8). Except for this, the reading method of FIG. 11C is the same among the normal operation, the normal HR state writing operation and the HR state writing recovery operation. However, during the HR state writing recovery operation, it is not necessary to perform the reading operation every time the negative voltage pulse is applied and every time the positive voltage pulse is applied.

Figure 12:
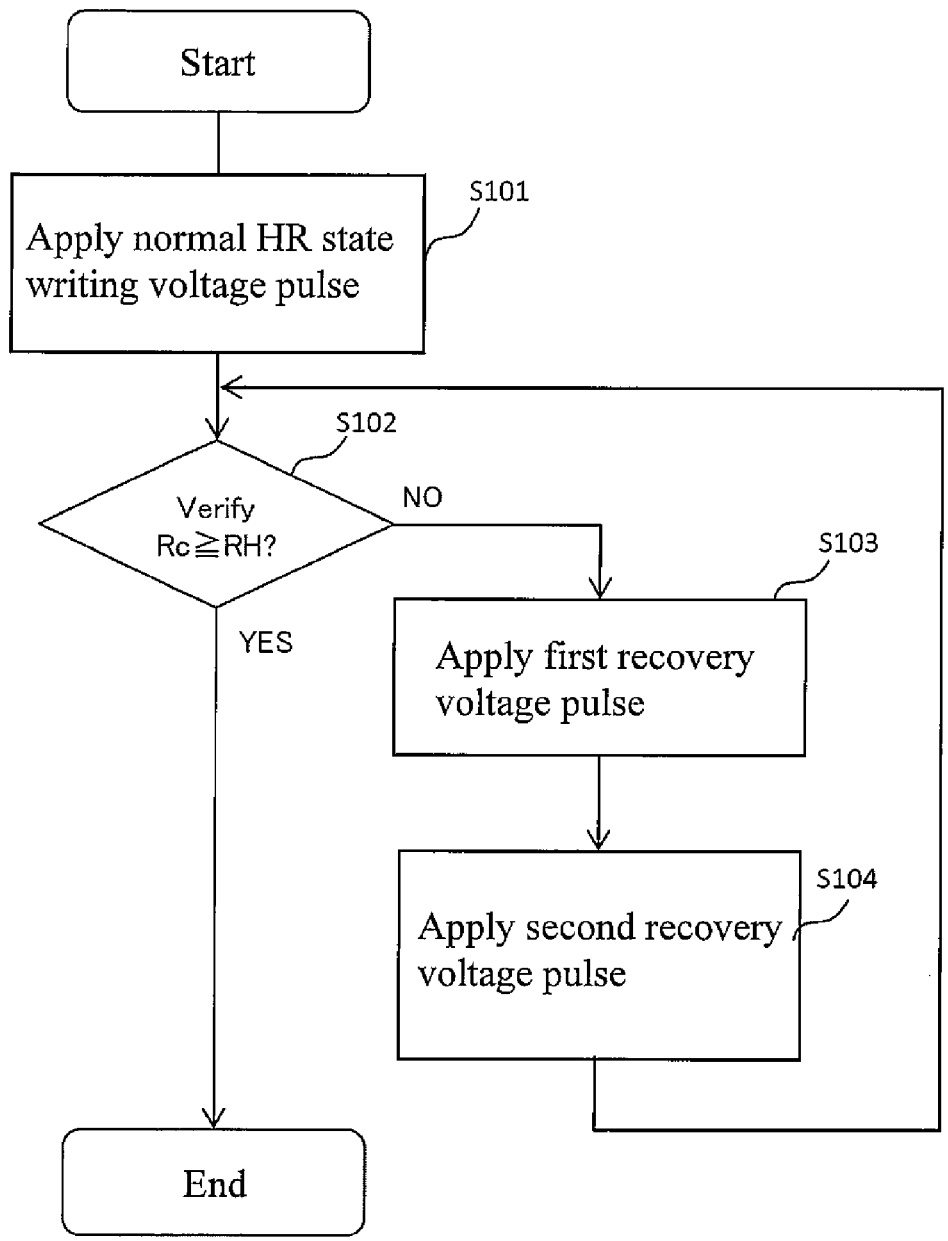
FIG. 12 is a flow diagram of HR state writing to perform recovery from the state of "LR frozen state" in the variable resistance non-volatile memory device according to Embodiment 1.

Next, the exemplary HR state writing recovery operation of the variable resistance non-volatile memory device will be described with reference to the flowchart of FIG. 12. As shown in FIG. 12, in a case where a memory cell (hereinafter will be referred to as selected memory cell) corresponding a selected address is in the LR state and should switch to the HR state, the control circuit 210 performs control so that the normal HR state writing voltage pulse (voltage: VH) is applied to the selected memory cell (S101), and then performs the HR state writing verify reading to determine whether or not a resistance value Rc of the selected memory cell is equal to or greater than the reference resistance RH (Rc≥RH) (S102). When the control circuit 210 determines that the resistance value Rc of the selected memory cell is equal to or greater than the HR state writing verify reference resistance RH (Rc≥RH) (Yes in S102), it determines that the selected memory cell is not in the state of "LR frozen state", and the HR state writing is completed correctly. On the other hand, when the control circuit 210 determines that the resistance value Rc of the selected memory cell is less than the HR state writing verify reference resistance RH (Rc<RH) (No in S102), it determines that the selected memory cell is in the state of "LR frozen state", and moves to the HR state writing recovery operation.

In the HR state writing recovery operation, the control circuit 210 applies to the selected memory cell the first recovery voltage pulse 12 (e.g., voltage: −Vrcl) (S103), then applies to the selected memory cell the second recovery voltage pulse 13 (e.g., voltage: Vrch) (S104), and then performs the HR state writing verify reading again as the second determination step (S102). This process (application of the recovery voltage pulse set) is repeated until it can be confirmed in the second determination step that the memory cell has switched to the HR state (Yes in S102).

Step S101 and step S104 correspond to the timing chart of FIG. 11B, step S103 corresponds to the timing chart of FIG. 11A, and step S2 corresponds to the timing chart of FIG. 11C.

By performing the operation for the HR state writing recovery from the state of "LR frozen state" of the present embodiment, in the above described manner, the state of "LR frozen state" can be resolved, the resistance changing operation of the memory cell array can be stabilized to a considerable level, and the life which can withstand rewriting can be extended.

[Modified Example of Flowchart of LR State Writing Recovery Operation]

Figure 13:
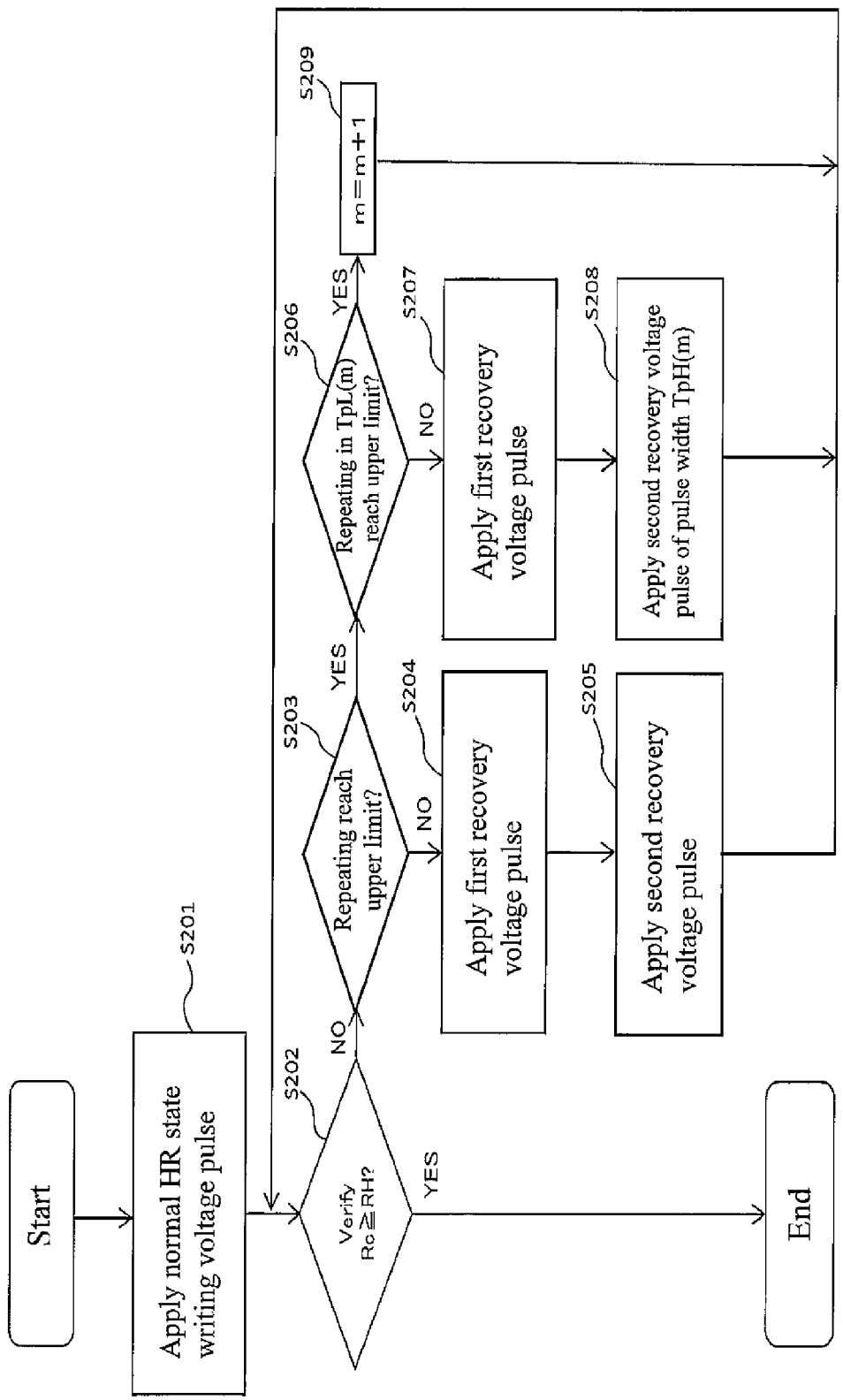
FIG. 13 is a flow diagram of HR state writing to perform recovery from the "LR frozen state" in a variable resistance non-volatile memory device according to Modified example of Embodiment 1.

Next, with reference to the flowchart of FIG. 13, a description will be given of the HR state writing recovery operation which uses the new recovery step in a case where the state of "LR frozen state" in a severe level, occurs, and the memory cell cannot switch to the HR state, even after the HR state writing recovery operation of FIG. 12 has been performed. In FIG. 13, the same constituents as those of FIG. 12 are designated by the same reference symbols, and will not be described in repetition. This operation example has a feature that every time the new second recovery voltage pulse 21 which has the same polarity as that of the HR state writing voltage pulse is applied predetermined number of times, the pulse width TpH (m) (m=1, 2, 3, . . . , TpH (1)<TpH (2)<TpH (3)< . . . ) of the new second recovery voltage pulse 21 is sequentially increased until the HR state writing recovery can be implemented. Specifically, when the HR state writing recovery is not implemented even after the new second recovery voltage pulse is applied predetermined number of times, the new second recovery voltage pulse 21 having the new pulse width TpH(m) obtained by addition of 1 to m, is applied to the memory cell.

As shown in FIG. 13, when the control circuit 210 determines that the resistance value Rc of the selected memory cell is less than the HR state writing verify reference resistance RH (Rc<RH) (No in S202) in the first determination step, it determines that the selected memory cell is in the state of "LR frozen state", and moves to the HR state writing recovery operation.

In the HR state writing recovery operation, the control circuit 210 performs the recovery step by applying to the selected memory cell the first recovery voltage pulse 12 (e.g., voltage: −Vrcl) (S204), and then applying to the selected memory cell the second recovery voltage pulse 13 (e.g., voltage: Vrch) (S205), and then performs the HR state writing verify reading again (S202). This process (application of the recovery voltage pulse set) is repeated until it can be confirmed that the memory cell has switched to the HR state (Yes in S202), or a predetermined upper limit number of times of this process is reached (Yes in S203).

If the above described process is repeated predetermined upper limit number of times under a state in which the memory cell cannot switch to the HR state (Yes in S203), then the control circuit 210 performs the recovery step to implement the HR state writing recovery, by applying the first recovery voltage pulse 20 (voltage: −Vrcl3) (S207) and applying the new second recovery voltage pulse 21 (voltage: Vrch3, pulse width: TpH(1)) (S208), and performs a third determination step by performing the HR state writing verify reading again (S202). This process (application of the new recovery voltage pulse set 19: additional recovery process) is repeated until it can be confirmed that the memory cell has switched to the HR state (Yes in S202), or a predetermined upper limit number of times of this process using the pulse width TpH (1) is reached (Yes in S206). If the above described process is repeated the predetermined upper limit number of times under a state in which the memory cell cannot switch to the HR state (Yes in S206), the control circuit 210 performs the recovery step to implement the HR state writing recovery, by incrementing the value of "m" by +1 (S209) to increase the pulse width of the new second recovery voltage pulse to TpH(2)(>TpH(1)), applying the first recovery voltage pulse 20 (e.g., voltage: −Vrcl3) again (S207), and applying the new second recovery voltage pulse 21 (voltage: Vrch3, pulse width TpH (2)) (step S208), and performs the HR state writing verify reading again (S202). This process (additional recovery process) is repeated while increasing the pulse width TpH(m) of the second recovery voltage pulse, until it can be confirmed that the memory cell has switched to the HR state in the third determination step (Yes in S202).

The predetermined upper limit number of times the process is repeated in step S203 and in step S206 may be once as necessary.

Step S208 corresponds to the timing chart of FIG. 11B (th=TpH (m)), and step S207 corresponds to the timing chart of FIG. 11A.

By performing the operation (additional recovery process) for the HR state writing recovery from the state of "LR frozen state" of the present modified example, in the above described manner, the state of "LR frozen state" can be resolved, the resistance changing operation of the memory cell array can be stabilized to a considerable level, and the life which can withstand rewriting can be further extended.

The initial pulse width TpH(1) of the new second recovery voltage pulse 21 may be greater than the pulse width of the normal HR state writing voltage pulse 10 (voltage: VH). For example, in a case where the pulse width of the normal HR state writing voltage pulse 10 (voltage: VH) is 50 ns, the pulse width of the new second recovery voltage pulse 21 may be set to be exponentially increased as TPH(1)=100 ns, TPH(2)=500 ns, TpH(3)=1 μs, TpH(4)=5 μs, TpH(5)=10 μs, TpH(6)=50 μs . . . . This makes it possible to efficiently implement the recovery from the state of "LR frozen state" in a short time.

In a case where the control circuit 210 determines that the selected memory cell does not switch to the HR state even after the HR state writing recovery operation of FIG. 13 has been performed, it may determine that this memory cell will not be able to be recovered to the HR state, and perform well-known alternative process (e.g., redundancy, error correction, etc.).

Moreover, in the HR state writing recovery operation of FIG. 13, application of the recovery voltage pulse set (step S203, step S204, step S205) may be omitted as necessary to reduce writing time. In other words, in the recovery step performed initially for recovery from the state of "LR frozen state", the pulse width of the second recovery voltage pulse may be set greater than that of the normal HR state writing voltage pulse.

Although the memory device of FIG. 7 includes 1T1R memory cells in which one variable resistance element is connected to the NMOS transistor as the switching element, the present embodiment is not limited to the 1T1R memory cells. For example, the present embodiment may be applied to 1D1R memory cells in which a bidirectional diode is used as the switching element.

Numeral improvements and alternative embodiments of the present disclosure will be conceived by those skilled in the art in view of the foregoing description. Accordingly, the description is to be construed as illustrative only, and is provided for the purpose of teaching those skilled in the art the best mode of carrying out the present disclosure. The details of the structure and/or function may be varied substantially without departing from the spirit of the present disclosure.

INDUSTRIAL APPLICABILITY

An aspect of the present disclosure is useful as a writing method of a variable resistance non-volatile memory element, and a variable resistance non-volatile memory device, which can ensure a proper operation window even when the number of times of rewriting increases, as a result stably continue a resistance changing operation, and significantly improve reliability of the non-volatile memory device.

REFERENCE SIGNS LIST 1 electrode
2 electrode
3 conductor layer
4 insulator layer 5 variable resistance element
10 high-resistance state writing voltage pulse, HR state writing voltage pulse
11 low-resistance state writing voltage pulse, LR state writing voltage pulse
12 first recovery voltage pulse
13 second recovery voltage pulse
19 new recovery voltage pulse set
20 first recovery voltage pulse
21 new second recovery voltage pulse
100 variable resistance element
100a lower electrode
100b variable resistance layer
100b-1 first metal oxide layer
100b-2 second metal oxide layer
100c upper electrode
101 lower electrode terminal
102 upper electrode terminal
103 gate terminal
104 NMOS transistor
105 lower electrode terminal
113 filament
200 non-volatile memory device
201 memory main body section
202 memory cell array
203 column select circuit
204 sense amplifier
205 data input/output circuit
206 write circuit
207 row driver
208 row select circuit
209 address input circuit
210 control circuit
211 writing power supply
212 low-resistance state writing power supply, LR state writing power supply
213 high-resistance state writing power supply, HR state writing power supply
218 current mirror circuit
219 clamp transistor
220 clamp transistor
221 reference circuit
222 select transistor
223 select transistor
224 differential amplifier
225 transistor
226 transistor
702 normal operation reference current generating circuit
703 HR state writing verify reference current generating circuit

What is claimed is:

1. A writing method of a variable resistance non-volatile memory element, in which a voltage pulse is applied to the variable resistance non-volatile memory element to reversibly change a resistance state of the variable resistance non-volatile memory element,
the variable resistance non-volatile memory element including a first electrode, a second electrode, and a variable resistance layer sandwiched between the first electrode and the second electrode;
the variable resistance layer including a first metal oxide layer which is in contact with the first electrode, and a second metal oxide layer which is in contact with the second electrode and is lower in degree of oxygen deficiency than the first metal oxide layer;
the variable resistance non-volatile memory element having a characteristic in which the variable resistance non-volatile memory element changes the resistance state from a first resistance state used to store first information to a second resistance state used to store second information by application of a pulse of a first voltage, and changes the resistance state from the second resistance state to the first resistance state by application of a pulse of a second voltage which is different in polarity from the first voltage;
the writing method comprising:
determining, in a first determination step, whether or not the resistance state of the variable resistance non-volatile memory element does not switch to the first resistance state and remains in the second resistance state, when the pulse of the second voltage is applied to the variable resistance non-volatile memory element; and
when it is determined that the resistance state of the variable resistance non-volatile memory element does not switch to the first resistance state and remains in the second resistance state in the first determination step,
applying, in a recovery step, at least once to the variable-resistance non-volatile memory element a recovery voltage pulse set composed of two pulses which are a first recovery voltage pulse which has the same polarity as that of the first voltage and a second recovery voltage pulse which has the same polarity as that of the second voltage, has a greater amplitude than the second voltage, and is applied subsequently to the first recovery voltage pulse.

2. The writing method of the variable resistance non-volatile memory element according to claim 1, further comprising:
determining, in a second determination step, whether or not the resistance state of the variable resistance non-volatile memory element has switched to the first resistance state by application of the recovery voltage pulse set; and
repeating application of the recovery voltage pulse set in the recovery step and determination in the second determination step.

3. The writing method of the variable resistance non-volatile memory element according to claim 1,
wherein the second recovery voltage pulse has a longer pulse width than the pulse of the second voltage.

4. The writing method of the variable resistance non-volatile memory element according to claim 2, comprising:
when the resistance state of the variable resistance non-volatile memory element does not switch to the first resistance state, after application of the recovery voltage pulse set in the recovery step and determination in the second determination step are repeated predetermined number of times,
converting the second recovery voltage pulse into a new second recovery voltage pulse having a longer pulse width than the second recovery voltage pulse, and then applying the recovery voltage pulse set to the variable resistance non-volatile memory element at least once in the recovery step.

5. The writing method of the variable resistance non-volatile memory element according to claim 2, comprising:
when the resistance state of the variable resistance non-volatile memory element does not switch to the first resistance state, after application of the recovery voltage pulse set in the recovery step and determination in the second determination step are repeated predetermined number of times,
repeating an additional recovery process until the resistance state of the variable resistance non-volatile memory element has switched to the first resistance state, the additional recovery process including converting the second recovery voltage pulse into a new second recovery voltage pulse having a longer pulse width than the second recovery voltage pulse and repeating predetermined number of times, application of the recovery voltage pulse set in the recovery step and determination in the second determination step.

6. The writing method of the variable resistance non-volatile memory element according to claim 4,
wherein the new second recovery voltage pulse has a greater amplitude than the second recovery voltage pulse before conversion.

7. The writing method of the variable resistance non-volatile memory element according to claim 1,
wherein the first metal oxide layer comprises a tantalum oxide and has a composition expressed as $TaO_x$; and
wherein the second metal oxide layer comprises a tantalum oxide and has a composition expressed as $TaO_y$ ($x<y$).

8. The writing method of the variable resistance non-volatile memory element according to claim 1,
wherein the variable resistance non-volatile memory element reversibly switches the resistance state between the high-resistance state and the low-resistance state;
wherein the first resistance state is the high-resistance state; and
wherein the second resistance state is the low-resistance state.

9. The writing method of the variable resistance non-volatile memory element according to claim 1,
wherein the first recovery voltage pulse has an amplitude which is equal to or less than an amplitude of the pulse of the first voltage.

10. The writing method of the variable resistance non-volatile memory element according to claim 1,
wherein the first recovery voltage pulse has an amplitude which is about as great as an amplitude of the pulse of the first voltage.

11. A variable resistance non-volatile memory device comprising:
a memory cell including a variable resistance non-volatile memory element and a switching element which are connected in series; and
a drive circuit for driving the memory cell;
the variable resistance non-volatile memory element including a first electrode, a second electrode, and a variable resistance layer sandwiched between the first electrode and the second electrode;
the variable resistance layer including a first metal oxide layer which is in contact with the first electrode, and a second metal oxide layer which is in contact with the second electrode and is lower in degree of oxygen deficiency than the first metal oxide layer;
the variable resistance non-volatile memory element having a characteristic in which the variable resistance non-volatile memory element changes the resistance state from a first resistance state used to store first information to a second resistance state used to store second information by application of a pulse of a first voltage, and changes the resistance state from the second resistance state to the first resistance state by application of a pulse of a second voltage which is different in polarity from the first voltage;
the drive circuit including:
a write circuit for writing information to the memory cell;
a sense amplifier for reading the information from the memory cell; and
a control circuit for determining using the sense amplifier, in a first determination step, whether or not the resistance state of the variable resistance non-volatile memory element does not switch to the first resistance state and remains in the second resistance state, when the pulse of the second voltage is applied to the variable resistance non-volatile memory element by the write circuit;
the control circuit being configured to control the write circuit in such a manner that, when the control circuit determines that the resistance state of the variable resistance non-volatile memory element does not switch to the first resistance state and remains in the second resistance state in the first determination step,
the control circuit performs a recovery step of causing the write circuit to apply at least once to the variable-resistance non-volatile memory element a recovery voltage pulse set composed of two pulses which are a first recovery voltage pulse which has the same polarity as that of the first voltage and a second recovery voltage pulse which has the same polarity as that of the second voltage, has a greater amplitude than the second voltage, and is applied subsequently to the first recovery voltage pulse.

12. The variable resistance non-volatile memory device according to claim 11,
wherein the control circuit is configured to further perform a second determination step of determining using the sense amplifier, whether or not the resistance state of the variable resistance non-volatile memory element has switched to the first resistance state by application of the recovery voltage pulse set, and repeats application of the recovery voltage pulse set in the recovery step and determination in the second determination step.

13. The variable resistance non-volatile memory device according to claim 11,
wherein the second recovery voltage pulse has a longer pulse width than the pulse of the second voltage.

14. The variable resistance non-volatile memory device according to claim 12,
wherein the control circuit is configured to convert the second recovery voltage pulse into a new second recovery voltage pulse having a longer pulse width than the second recovery voltage pulse, and then apply the recovery voltage pulse set to the variable resistance non-volatile memory element at least once in the recovery step, when the resistance state of the variable resistance non-volatile memory element does not switch to the first resistance state, after the control circuit has repeated predetermined number of times application of the recovery voltage pulse set in the recovery step and determination in the second determination step.

15. The variable resistance non-volatile memory device according to claim 12,
wherein the control circuit is configured to repeat an additional recovery process until the resistance state of the variable resistance non-volatile memory element has switched to the first resistance state, the additional recovery process including converting the second recovery voltage pulse into a new second recovery voltage pulse having a longer pulse width than the second recovery voltage pulse, and repeating predetermined number of times, application of the recovery voltage pulse set in the recovery step and determination in the second determination step, when the resistance state of the variable resistance non-volatile memory element does not switch to the first resistance state, after the control circuit has repeated predetermined number of times application of the recovery voltage pulse set in the recovery step and determination in the second determination step.

16. The variable resistance non-volatile memory device according to claim 14,
wherein the new second recovery voltage pulse has a greater amplitude than the second recovery voltage pulse before conversion.

17. The variable resistance non-volatile memory device according to claim 11,
wherein the first metal oxide layer comprises a tantalum oxide and has a composition expressed as $TaO_x$; and
wherein the second metal oxide layer comprises a tantalum oxide and has a composition expressed as $TaO_y$ (x<y).

18. The variable resistance non-volatile memory device according to claim 11,
wherein the variable resistance non-volatile memory element reversibly switches the resistance state between a high-resistance state and a low-resistance state;
wherein the first resistance state is the high-resistance state; and
wherein the second resistance state is the low-resistance state.

19. The variable resistance non-volatile memory device according to claim 11,
wherein the first recovery voltage pulse has an amplitude which is equal to or less than an amplitude of the pulse of the first voltage.

20. The variable resistance non-volatile memory device according to claim 11,
wherein the first recovery voltage pulse has an amplitude which is about as great as an amplitude of the pulse of the first voltage.

21. The variable resistance non-volatile memory device according to claim 11,
wherein the switching element is a MOS transistor.

22. The variable resistance non-volatile memory device according to claim 11,
wherein the switching element is a bidirectional diode.

* * * * *